(12) United States Patent
Isobe et al.

(10) Patent No.: US 7,692,223 B2
(45) Date of Patent: Apr. 6, 2010

(54) SEMICONDUCTOR DEVICE AND METHOD FOR MANUFACTURING THE SAME

(75) Inventors: Atsuo Isobe, Isehara (JP); Tamae Takano, Atsugi (JP); Yasuyuki Arai, Atsugi (JP); Fumiko Terasawa, Atsugi (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 228 days.

(21) Appl. No.: 11/785,145

(22) Filed: Apr. 16, 2007

(65) Prior Publication Data

US 2007/0252179 A1 Nov. 1, 2007

(30) Foreign Application Priority Data

Apr. 28, 2006 (JP) ............................. 2006-126636

(51) Int. Cl.
*H01L 27/088* (2006.01)
(52) U.S. Cl. .................... 257/288; 257/E27.06
(58) Field of Classification Search .............. 257/59, 257/66, 72, E39.02, 410, 409, 324, 501, 508, 257/488, 489, 491, 494, 411, E27.064, E27.108, 257/E27.046, E21.637, E21.632; 438/157
See application file for complete search history.

(56) References Cited

U.S. PATENT DOCUMENTS

| | | | |
|---|---|---|---|
| 4,070,211 A | 1/1978 | Harari | |
| 4,142,926 A | 3/1979 | Morgan | |
| 4,189,737 A * | 2/1980 | Schrader et al. | 257/337 |
| 4,242,156 A | 12/1980 | Peel | |
| 4,277,884 A | 7/1981 | Hsu | |
| 4,335,504 A | 6/1982 | Lee | |
| 4,373,255 A | 2/1983 | Goronkin | |
| 4,385,937 A | 5/1983 | Ohmura | |
| 4,393,572 A | 7/1983 | Policastro et al. | |
| 4,546,376 A | 10/1985 | Nakata et al. | |
| 4,581,620 A | 4/1986 | Yamazaki et al. | |
| 4,876,582 A | 10/1989 | Janning | |
| 4,959,700 A | 9/1990 | Yamazaki | |

(Continued)

FOREIGN PATENT DOCUMENTS

EP    0 405 063    1/1991

(Continued)

*Primary Examiner*—Zandra Smith
*Assistant Examiner*—Galina Yushina
(74) *Attorney, Agent, or Firm*—Eric J. Robinson; Robinson Intellectual Property Law Office, P.C.

(57) ABSTRACT

A manufacturing method of a semiconductor device of the present invention includes the steps of forming a stacked body in which a semiconductor film, a gate insulating film, and a first conductive film are sequentially stacked over a substrate; selectively removing the stacked body to form a plurality of island-shaped stacked bodies; forming an insulating film to cover the plurality of island-shaped stacked bodies; removing a part of the insulating film to expose a surface of the first conductive film, such that a surface of the first conductive film almost coextensive with a height of the insulating film; forming a second conductive film over the first conductive film and a left part of the insulating film; forming a resist over the second conductive film; selectively removing the first conductive film and the second conductive film using the resist as a mask.

6 Claims, 23 Drawing Sheets

U.S. PATENT DOCUMENTS

| | | | |
|---|---|---|---|
| 5,153,142 A | 10/1992 | Hsieh | |
| 5,153,702 A | 10/1992 | Aoyama et al. | |
| 5,177,578 A | 1/1993 | Kakinoki et al. | |
| 5,202,273 A * | 4/1993 | Nakamura | 505/330 |
| 5,225,356 A | 7/1993 | Omura et al. | |
| 5,314,841 A | 5/1994 | Brady et al. | |
| 5,381,029 A | 1/1995 | Eguchi et al. | |
| 5,412,240 A | 5/1995 | Inoue et al. | |
| 5,434,441 A | 7/1995 | Inoue et al. | |
| 5,463,230 A | 10/1995 | Negoto et al. | |
| 5,583,369 A | 12/1996 | Yamazaki et al. | |
| 5,893,730 A | 4/1999 | Yamazaki et al. | |
| 5,929,479 A | 7/1999 | Oyama | |
| 6,365,933 B1 | 4/2002 | Yamazaki et al. | |
| 6,388,291 B1 | 5/2002 | Zhang et al. | |
| 6,433,361 B1 | 8/2002 | Zhang et al. | |
| 6,812,491 B2 | 11/2004 | Kato et al. | |
| 2004/0007748 A1 * | 1/2004 | Sakama et al. | 257/410 |
| 2007/0018258 A1 * | 1/2007 | Chen et al. | 257/409 |

FOREIGN PATENT DOCUMENTS

| | | |
|---|---|---|
| EP | 0 480 803 | 4/1992 |
| EP | 0 513 590 | 11/1992 |
| JP | 53-026584 | 3/1978 |
| JP | 55-068651 | 5/1980 |
| JP | 55-075238 | 6/1980 |
| JP | 58-025266 | 2/1983 |
| JP | 58-056467 | 4/1983 |
| JP | 60-225478 | 11/1985 |
| JP | 62-061360 | 3/1987 |
| JP | 01-241859 | 9/1989 |
| JP | 08-018055 | 1/1996 |

* cited by examiner

SEMICONDUCTOR LAYER

MEMORY CELL

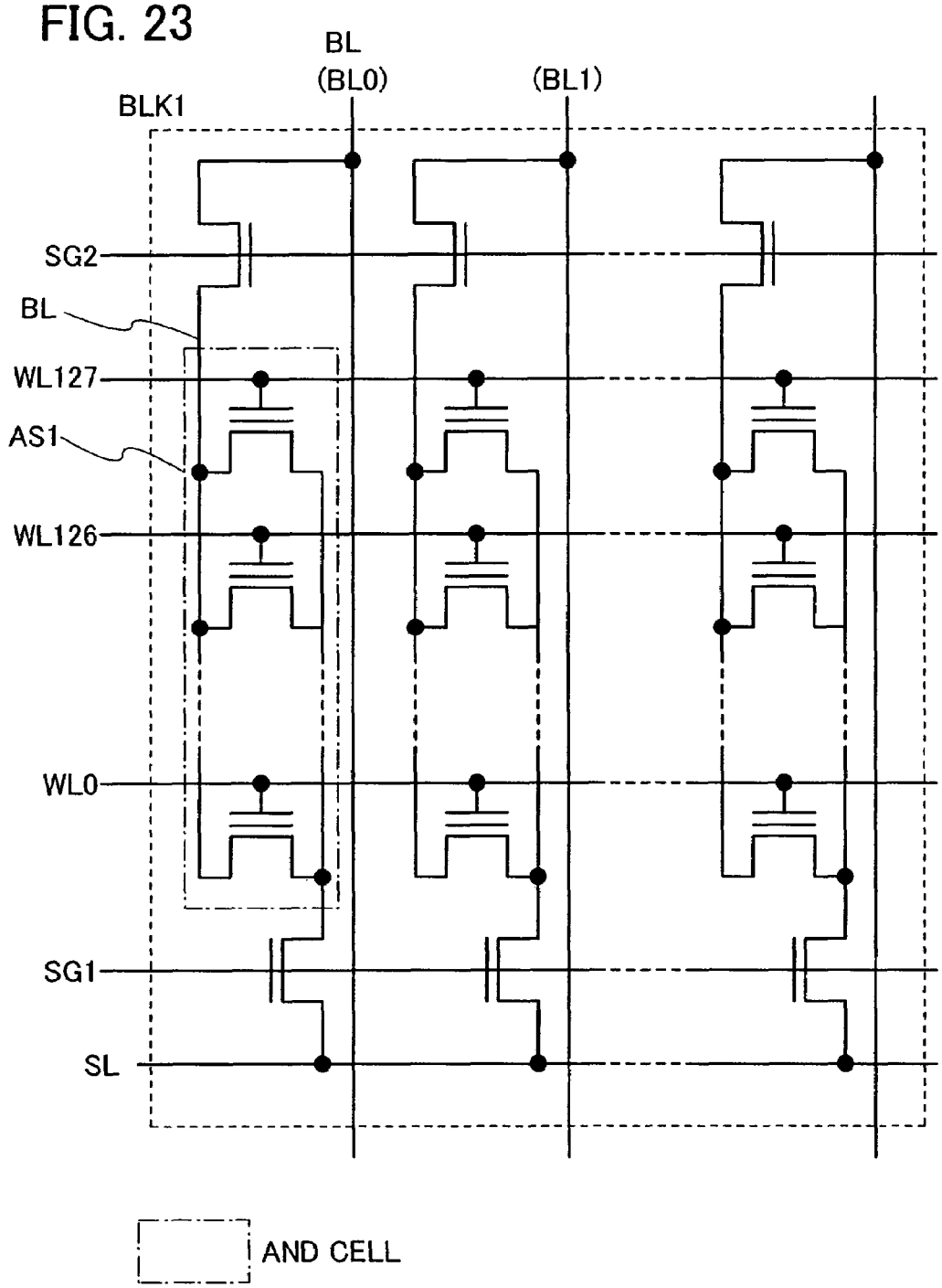

SEMICONDUCTOR DEVICE AND METHOD FOR MANUFACTURING THE SAME

BACKGROUND OF THE INVENTION

1. Field of the Invention

The present invention relates to semiconductor devices and methods for manufacturing the same.

2. Description of the Related Art

In recent years, semiconductor devices have been actively manufactured, in which thin film transistors (TFTs) are formed over a substrate having an insulating surface, such as a glass substrate, and the thin film transistors are used as switching elements or the like. The thin film transistors are formed so that island-shaped semiconductor films are formed over a substrate having an insulating surface by a CVD method, a photolithography process, or the like, and parts of the island-shaped semiconductor films are used as channel forming regions (for example, Reference 1: Japanese Published Patent Application No. H08-018055)

FIGS. 19A to 19C are schematic views of a general thin film transistor. First, a thin film transistor has an island-shaped semiconductor film 903 formed over a substrate 901 with an insulating film 902 serving as a base film interposed therebetween, and a conductive film 905 serving as a gate electrode with a gate insulating film 904 interposed therebetween. The conductive film 905 is provided so as to cross the island-shaped semiconductor film 903. The semiconductor film 903 has a channel forming region 903a formed in a region which overlaps with the conductive film 905, and impurity regions 903b forming source and drain regions. Further, a conductive film 907 forming source and drain electrodes is provided so as to be electrically connected to the impurity region 903b. FIGS. 19B and 19C show cross-sectional structures taken along the lines $C_1$-$D_1$ and $C_2$-$D_2$, respectively, in FIG. 19A.

SUMMARY OF THE INVENTION

However, in a case where a semiconductor film is formed in an island shape, although a plurality of elements can be separated from each other, level difference is generated at an end portion of the semiconductor film, leading to a problem that coverage by a gate insulating film is not sufficiently performed at the end portion of the semiconductor film. In particular, in recent years, a gate insulating film is desired to be thinned in order to reduce power consumption and increase operation speed of a thin film transistor. Therefore, in a case where a gate insulating film is provided to be thin, a defective coverage of the gate insulating film at the end portion of a semiconductor film becomes a more notable problem. In a case where the gate insulating film does not sufficiently cover the end portion of the semiconductor film, short circuit or the like between the conductive film forming the gate electrode and the semiconductor film may occur at the end portion of the semiconductor film. Further, when the gate insulating film at the end portion of a channel forming region of the semiconductor film is formed to be thin, current leaks between a gate electrode and the end portion of the channel forming region of the semiconductor film, leading to a problem such as deterioration in electric characteristics of the thin film transistor.

Furthermore, in a case where a fixed charge is trapped at the end portion of the semiconductor film due to break of the gate insulating film or a treatment in a manufacturing process, the characteristic of a channel forming region at the end portion is changed as compared with the central portion of the semiconductor film, leading to a problem such as an influence on characteristics of the thin film transistor.

In view of the foregoing problems, it is an object of the present invention to provide a semiconductor device which reduces the influence of the characteristic of the end portion of a channel forming region in a semiconductor film, on electric characteristics of a thin film transistor, and a manufacturing method of the semiconductor device.

A semiconductor device of the present invention includes an island-shaped semiconductor film formed over a substrate; an insulating film provided in contact with a side face of the semiconductor film; a gate insulating film provided in contact with a surface of the semiconductor film; a first conductive film provided over the gate insulating film; and a second conductive film provided in contact with a surface of the first conductive film and a surface of the insulating film, wherein a position of a part of an end portion of the semiconductor film is coextensive with a position of a part of an end portion of the first conductive film. "A position of a part of an end portion of the semiconductor film is coextensive with a position of a part of an end portion of the first conductive film" indicates that the side face of the semiconductor film and the side face of the first conductive film are almost aligned at least in parts of the semiconductor film and the first conductive film. Note that "surface" used in the present invention indicates a top face.

A semiconductor device of the present invention includes an island-shaped semiconductor film formed over a substrate; an insulating film provided in contact with a part of a side face of the semiconductor film; a gate insulating film provided in contact with a surface of the semiconductor film; a first conductive film provided over the gate insulating film; a second conductive film provided in contact with a surface of the first conductive film and a surface of the insulating film, and a sidewall provided in contact with a side face of the first conductive film and a side face of the second conductive film, wherein a position of a part of an end portion of the semiconductor film is coextensive with a position of a part of an end portion of the first conductive film. In addition, an end portion of the insulating film and an end portion of the second conductive film may be aligned.

A semiconductor device of the present invention includes a semiconductor film including a channel forming region, a source region, a drain region, impurity regions having a conductivity type different from that of the source region and the drain region; an insulating film provided in contact with a side face of the semiconductor film; a gate insulating film provided in contact with a surface of the semiconductor film; a first conductive film provided over the gate insulating film; and a second conductive film provided in contact with a surface of the first conductive film and a surface of the insulating film, wherein the channel forming region is provided between the source region and the drain region, wherein the impurity regions are provided at end portions of the semiconductor film and adjacent to the channel forming region, the source region and the drain region, and wherein a position of a part of the end portion of the semiconductor film is coextensive with a position of a part of an end portion of the first conductive film.

A semiconductor device of the present invention includes an island-shaped semiconductor film formed over a substrate; a first insulating film provided in contact with a side face of the semiconductor film; a tunnel insulating film provided in contact with a surface of the semiconductor film; a charge accumulating layer provided over the tunnel insulating film; a second insulating film provided in contact with a surface of the charge accumulating layer and a surface of the first insulating film; and a conductive film formed over the second insulating film, wherein a position of a part of an end portion of the semiconductor film is coextensive with a position of a part of an end portion of the charge accumulating layer.

A semiconductor device of the present invention includes an island-shaped semiconductor film formed over a substrate; a first insulating film provided in contact with a part of a side face of the semiconductor film; a tunnel insulating film provided in contact with a surface of the semiconductor film; a charge accumulating layer provided over the tunnel insulating film; a second insulating film provided in contact with a surface of the charge accumulating layer and a surface of the first insulating film; a conductive film formed over the second insulating film; and a sidewall provided in contact with side faces of the charge accumulating layer, the second insulating film and the conductive film, wherein a position of a part of an end portion of the semiconductor film is coextensive with an end portion of the charge accumulating layer. In addition, in the structure, an end portion of the first insulating film, an end portion of the second insulating film and an end portion of the conductive film are coextensive with each other.

A manufacturing method of a semiconductor device of the present invention includes the steps of forming a stacked body in which a semiconductor film, a gate insulating film, and a first conductive film are sequentially stacked over a substrate; selectively removing the stacked body to form a plurality of island-shaped stacked bodies; forming an insulating film to cover the plurality of island-shaped stacked bodies; removing a part of the insulating film to expose a surface of the first conductive film, such that a surface of the first conductive film almost is coextensive with a height of the insulating film; forming a second conductive film over the first conductive film and a left part of the insulating film; forming a resist over the second conductive film; and selectively removing the first conductive film and the second conductive film using the resist as a mask.

A manufacturing method of a semiconductor device of the present invention includes the steps of forming a stacked body in which a semiconductor film, a gate insulating film, and a first conductive film are sequentially stacked over a substrate; selectively removing the stacked body to form a plurality of island-shaped stacked bodies; forming an insulating film to cover the plurality of island-shaped stacked bodies; removing a part of the insulating film to expose a surface of the first conductive film, such that a surface of the first conductive film almost coextensive with a height of the insulating film; forming a second conductive film over the first conductive film and a left part of the insulating film; forming a resist over the second conductive film; selectively removing the first conductive film and the second conductive film using the resist as a mask; selectively adding a first impurity element into the semiconductor film using the first conductive film and the second conductive film as masks to form a first impurity region in the semiconductor film; forming a sidewall to be in contact with side faces of the first conductive film and the second conductive film; and selectively adding a second impurity element into the semiconductor film using the first conductive film, the second conductive film and the sidewall as masks to form a second impurity region in the semiconductor film.

A manufacturing method of a semiconductor device of the present invention includes the steps of forming a stacked body in which a semiconductor film, a first insulating film, and a charge accumulating layer are sequentially stacked over a substrate; selectively removing the stacked body to form a plurality of island-shaped stacked bodies; forming a second insulating film to cover the plurality of island-shaped stacked bodies; removing a part of the second insulating film to expose a surface of the charge accumulating layer, such that a surface of the semiconductor film almost coextensive with a height of the insulating film; forming a third insulating film over the charge accumulating layer and a left part of the second insulating film; forming a conductive film over the third insulating film; forming a resist over the conductive film; and selectively removing the first insulating film, the charge accumulating layer, the third insulating film and the conductive film using the resist as a mask.

At an end portion of an island-shaped semiconductor film which overlaps with a conductive film serving as a gate electrode and a gate wiring, an insulating film is formed so as to be in contact with a side face of the semiconductor film, and the conductive film is formed over the insulating film. Thus, disconnection (or broken) of the conductive film at the end portion of the semiconductor film can be prevented and an influence on a transistor by the characteristic of an end portion of a channel region in the semiconductor film can be reduced.

BRIEF DESCRIPTION OF THE DRAWINGS

In the accompanying drawings:

FIG. 23 shows an example of a memory portion included in a semiconductor device according to an aspect of the present invention.

DETAILED DESCRIPTION OF THE INVENTION

Figure 1A:
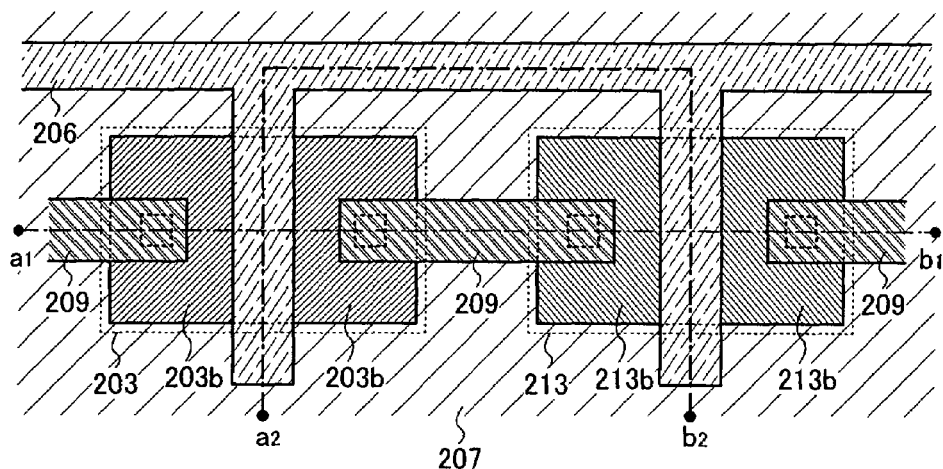
FIGS. 1A to 1C show an example of a semiconductor device according to an aspect of the present invention.

Embodiment Modes of the present invention will be explained below with reference to the accompanied drawings. However, the present invention is not limited to description to be given below. It is easily understood by those skilled in the art that modes and details disclosed herein can be modified in various ways without departing from the spirit and the scope of the present invention. Therefore, the present invention should not be interpreted as being limited to the description of the embodiment modes to be given below. It is to be noted that, in the present invention explained below, there is a case that like portions or portions having a like function are denoted by the same reference numerals through the drawings.

Embodiment Mode 1

Embodiment Mode 1 will describe, as an example, a semiconductor device according to the present invention and a manufacturing method thereof with reference to drawings.

Figure 1B:
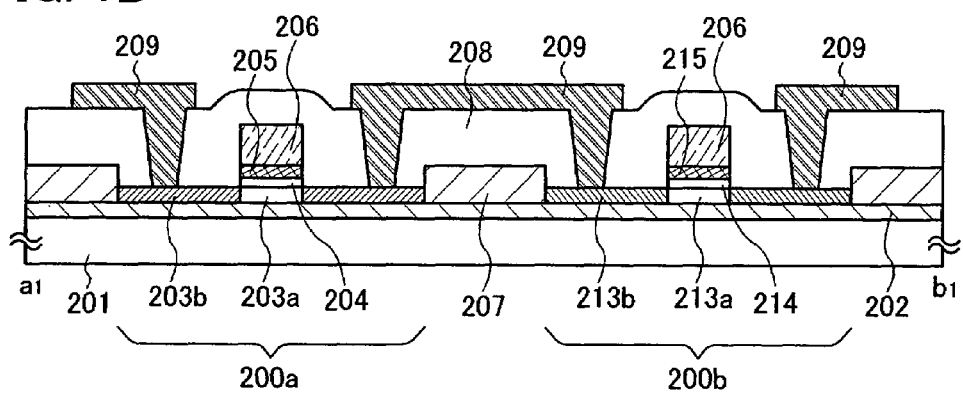
Figure 1C:
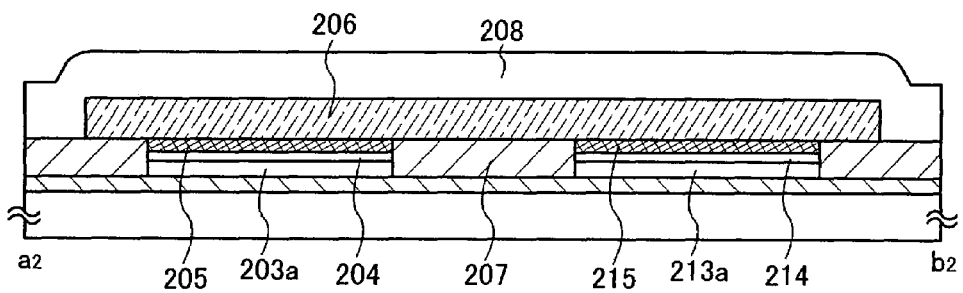

FIGS. 1A to 1C show a semiconductor device of this embodiment mode. FIG. 1A is a top view of a semiconductor device shown in this embodiment mode, FIG. 1B is a cross sectional view taken along the line $a_1$ to $b_1$ of FIG. 1A, and FIG. 1C is a cross sectional view taken along the line $a_2$ to $b_2$ of FIG. 1A.

The semiconductor device shown in this embodiment mode includes a thin film transistor 200a including a semiconductor film 203 which is island-shaped and formed over a substrate 201 with an insulating film 202 interposed therebetween, and a thin film transistor 200b including a semiconductor film 213. The thin film transistor 200a includes a first conductive film 205 and a second conductive film 206 which are formed over the semiconductor film 203 with a gate insulating film 204 interposed therebetween. The thin film transistor 200b includes a first conductive film 215 and a second conductive film 206 which are formed over the semiconductor film 213 with a gate insulating film 214 interposed therebetween.

In addition, in FIGS. 1A to 1C, the semiconductor film 203 in the thin film transistor 200a includes a channel forming region 203a in a region in which the semiconductor film 203 overlaps with the first conductive film 205, and first impurity regions 203b which serve as source and drain regions adjacent to the channel forming region 203a. The semiconductor film 213 in the thin film transistor 200b includes a channel forming region 213a in a region in which the semiconductor film 213 overlaps with the first conductive film 215, and first impurity regions 213b which serve as source and drain regions adjacent to the channel forming region 213a. Note that the first impurity regions 213b serving as source and drain regions are formed such that the channel forming region 213a is interposed therebetween.

The semiconductor device shown in this embodiment mode includes an insulating film 207 which are formed between the thin film transistor 200a and the thin film transistor 200b. The insulating film 207 is provided such that it is contact with at least side faces of the semiconductor film 203 and the semiconductor film 213. In other words, the semiconductor film 203 and the semiconductor film 213 are surrounded by the insulating film 207. In addition, the insulating film 207 may be provided so as to be in contact with parts of side faces of the gate insulating films 204, 214 and parts of side faces of the first conductive films 205, 215.

In addition, the second conductive film 206 is formed over the first conductive films 205, 215 and the insulating film 207 such that the second conductive film 206 is in contact with surfaces (top faces) of the first conductive films 205, 215 and the insulating film 207. In other words, in the semiconductor device shown in this embodiment mode, the gate insulating films 204, 214 and the conductive films 205, 215 are not formed over the insulating film 207, even if a part of side faces thereof is in contact with the insulting film 207.

The insulating film 207 is provided such that the surface of the insulating film 207 and the surface of the first conductive films 205, 215 are at almost the same level in height. Note that "at almost the same level in height" means a case where a level of the surface of the insulating film 207 is exactly the same as a level of the surfaces of the first conductive films 205, 215 and a case where the level of the surface of the insulating film 207 is not exactly the same as the level of the surfaces of the first conductive films 205, 215. A level difference between the surfaces of the first conductive films 205, 215 and the surface of the insulating film 207 is made smaller than the level of a stacked structure of the semiconductor film 203, the gate insulating film 204 and the first conductive film 205 or the level of a stacked structure of the semiconductor film 213, the gate insulating film 214 and the first conductive film 215. Thus, steps (level difference) at end portions of the semiconductor films 203, 213 can be reduced.

As a result, even when the gate insulating film is thinned, deterioration of electric characteristics of a thin film transistor caused by leakage current with the gate electrode at an end portion of a channel forming region in the semiconductor film can be suppressed.

In the thin film transistors 200a, 200b, the first conductive films 205, 215 serve as gate electrodes and the second conductive film 206 serves as a gate electrode and a gate wiring.

Note that the gate electrode indicates a conductive film in a portion in which the conductive film overlaps with a semiconductor forming a channel region or an LDD (lightly doped drain) region with the gate insulating film interposed therebetween. The gate wiring is a wiring used for connection with a gate electrode of another thin film transistor or a wiring used for connecting a gate electrode and another wiring. Note that there is a portion which serves as both a gate electrode and a gate wiring (for example, the conductive film 206 in this embodiment mode). Such a portion may be called a gate electrode or a gate wiring. In other words, there is a region which cannot be classified into either a gate electrode or a gate wiring. For example, when a channel region overlaps with a gate wiring which is extended, the overlapping portion serves as a gate wiring and also as a gate electrode. Thus, such a region may be called a gate electrode or a gate wiring.

Next, an example of manufacturing the semiconductor device shown in FIGS. 1A to 1C is described with reference to FIGS. 2A to 2E, 3A to 3C, 4A to 4E and 5A, 5B. FIGS. 2A to 2E and 3A to 3C are cross sectional views taken along the line $a_1$ to $b_1$ of FIG. 1A, and FIGS. 4A to 4E and 5A, 5B are cross sectional views taken along the line $a_2$ to $b_2$ of FIG. 1A.

Figure 2A:
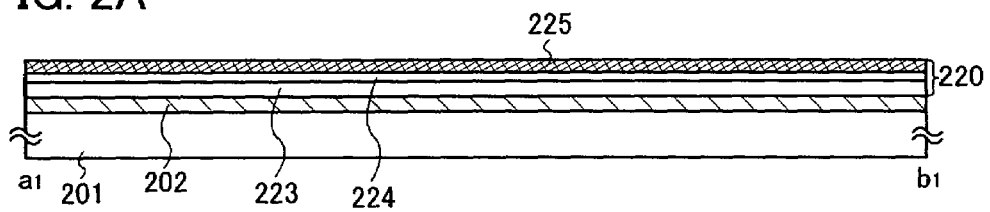
FIGS. 2A to 2E show an example of a manufacturing method of a semiconductor device according to an aspect of the present invention.
Figure 4A:
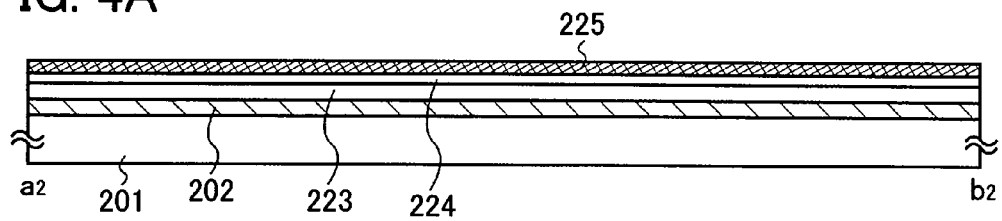
FIGS. 4A to 4E show an example of a manufacturing method of a semiconductor device according to an aspect of the present invention.

A semiconductor film 223, a gate insulating film 224 and a first conductive film 225 are stacked over a substrate 201 with an insulating film 202 interposed between the substrate and the stacked films (FIGS. 2A and 4A).

As the substrate 201, a glass substrate, a quartz substrate, a ceramic substrate, a metal substrate (for example, a stainless steel substrate or the like), or a semiconductor substrate such as a Si substrate or the like can be used. Further, a plastic substrate can be used, such as polyethylene terephthalate (PET), polyethylene naphthalate (PEN), polyether sulfone (PES), or acrylic.

The insulating film 202 is formed by a CVD method or a sputtering method, using an insulating material such as silicon oxide, silicon nitride, silicon oxynitride (SiOxNy), (x>y>0), or silicon nitride oxide (SiNxOy) (x>y>0). For example, when the insulating film 202 is formed to have a two-layer structure, it is preferable to form a silicon nitride oxide film as the first layer insulating film, and form a silicon oxynitride film as the second layer insulating film. Alternatively, a silicon nitride film may be formed as the first layer insulating film and a silicon oxide film may be formed as the second layer insulating film. In this manner, formation of the insulating film 202 serving as a blocking layer can prevent adverse effects of alkaline metals such as Na or alkaline earth metals contained in the substrate 201 to elements formed thereover. In a case where quartz is used for the substrate 201, the insulating film 202 may be omitted.

The semiconductor film 223 is formed using an amorphous semiconductor film or a crystalline semiconductor film. The crystalline semiconductor film includes a film which is obtained by a step of crystallizing an amorphous semiconductor film formed over the insulating film 202 by a heat treatment or laser irradiation; a film which is obtained by a step of making a crystalline semiconductor film formed over the insulating film 202 amorphous, and then, recrystallizing the amorphous semiconductor film; and the like.

In the case of conducting crystallization or recrystallization by laser irradiation, an LD-pumped continuous wave (CW) laser (e.g., $YVO_4$ with a second harmonic (wavelength of 532 nm)) can be used as a laser light source. Although the wavelength is not specifically limited to the second harmonic, the second harmonic is superior to harmonics higher than that in terms of energy efficiency. When a semiconductor film is irradiated with CW laser, energy can be continuously given to the semiconductor film. Therefore, once the semiconductor film is made into a molten state, the molten state can be retained. Further, by scanning the semiconductor film with CW laser, a solid-liquid interface of the semiconductor film can move, and crystal grains which are long in one direction can be formed in the moving direction. The reason for using a solid-state laser is that more stable output than by using a gas laser or the like can be obtained, and thus more stable treatment can be expected. It is to be noted that the laser light source is not limited to a CW laser, and a pulsed laser with a repetition rate of 10 MHz or higher can be used as well. When a pulsed laser with a high repetition rate is used, the semiconductor film can be constantly retained in the molten state on the condition that a pulse interval of laser is shorter than a time interval from the point when the semiconductor film is melted until the point when the semiconductor film becomes solidified. Thus, a semiconductor film with crystal grains which are long in one direction can be formed by movement of the solid-liquid interface. It is also possible to employ other types of CW lasers or pulsed lasers with a repetition rate of 10 MHz or higher. For example, gas lasers such as an Ar laser, a Kr laser, and a $CO_2$ laser can be used, or solid-state lasers such as a YAG laser, a YLF laser, a $YalO_3$ laser, a $GdVO_4$ laser, a KGW laser, a KYW laser, an alexandrite laser, a Ti:sapphire laser, a $Y_2O_3$ laser, and a $YVO_4$ laser can be used. A YAG laser, a $Y_2O_3$ laser, a $GdVO_4$ laser, a $YVO_4$ laser, and the like are called ceramic lasers. As a metal vapor laser, helium-cadmium laser and the like can be given as examples. Laser light is preferably emitted from a laser oscillator with $TEM_{00}$ (single transverse mode), which can increase the energy uniformity of a linear beam spot that is obtained on the irradiation surface. Besides, a pulsed excimer laser may also be used.

The gate insulating film 224 is formed using silicon oxide, silicon nitride, silicon oxynitride (SiOxNy) (x>y>0), silicon nitride oxide (SiNxOy) (x>y>0), or the like. Such an insulating layer is formed by a vapor growth method or a sputtering method. Alternatively, the gate insulating film 224 can be formed by a high density plasma treatment such as oxidation treatment or nitridation treatment in which the surface of the semiconductor film 223 is oxidized or nitrided under an atmosphere containing oxygen (e.g., an atmosphere containing oxygen ($O_2$) and a rare gas (containing at least one of He, Ne, Ar, Kr, and Xe), or an atmosphere containing oxygen, hydrogen ($H_2$), and a rare gas); or an atmosphere containing nitrogen (e.g., an atmosphere containing nitrogen ($N_2$) and a rare gas (containing at least one of He, Ne, Ar, Kr, and Xe), an atmosphere containing nitrogen, hydrogen, and a rare gas, or an atmosphere containing $NH_3$ and a rare gas).

The high density plasma treatment is performed at an electron density of $1 \times 10^{11}$ cm$^{-3}$ or higher and an electron temperature of plasma of 1.5 eV or lower in the atmosphere containing the gases described above. More specifically, the electron density is greater than or equal to $1 \times 10^{11}$ cm$^{-3}$ and less than or equal to $1 \times 10^{13}$ cm$^{-3}$, and the electron temperature of plasma is greater than or equal to 0.5 eV and less than or equal to 1.5 eV. The electron density of plasma is high and the electron temperature around an object to be treated (here, the semiconductor film 223) formed over the substrate 201 is low; therefore, the object to be treated can be prevented from being damaged by plasma. In addition, because the electron density of plasma is as high as $1 \times 10^{11}$ cm$^{-3}$ or more, the oxide film or the nitride film formed by oxidizing or nitriding of the object to be treated by the plasma treatment has superior uniformity of a film thickness or the like as compared with a film formed by a CVD method, a sputtering method, or the like, and can be denser. In addition, since the electron temperature of plasma is as low as 1.5 eV or lower, the oxidation or nitridation treatment can be performed at a lower temperature than a conventional plasma treatment or a thermal oxidation method. For example, the oxidation or nitridation treatment can be performed sufficiently even if the plasma treatment is performed at a temperature lower by at least 100° C. than a strain point of a glass substrate. As the frequency for producing plasma, high frequency waves such as microwaves (2.45 GHz) can be used. By oxidizing or nitriding of the surface of the semiconductor film 223 by the high density plasma treatment to form the gate insulating film 224, defect level density which will trap electrons or holes can be reduced. Further, also at the end portion of the semiconductor film 223, disconnection or the like of the gate insulating film 224 can be reduced.

Further, in order to control a threshold value or the like of the semiconductor film 223, an impurity element may be added, in advance, into the semiconductor film 223 at low concentration. In this case, the impurity element is added into a region which later serves as a channel forming region in the semiconductor film 223. As the impurity element, an impurity element imparting an n-type conductivity or an impurity element imparting a p-type conductivity can be used. As the impurity element imparting an n-type conductivity, phosphorus (P), arsenic (As), or the like can be used. As the impurity element imparting a p-type conductivity, boron (B), aluminum (Al), gallium (Ga), or the like can be used. Here, as the impurity element, boron (B) is added into the entire surface of the semiconductor film 223 in advance so that boron is contained at a concentration of $5 \times 10^{15}/cm^3$ to $5 \times 10^{17}/cm^3$.

The first conductive film 225 can be formed as a single layer structure or a stacked layer structure using an element selected from tantalum (Ta), tungsten (W), titanium (Ti), molybdenum (Mo), aluminum (Al), copper (Cu), chromium (Cr), niobium (Nb), and the like; or an alloy material or a compound material containing the element as a main component. Alternatively, the first conductive film 225 can be formed using a semiconductor material typified by polycrystalline silicon doped with an impurity element such as phosphorus. Further, tantalum nitride, tungsten nitride, molybdenum nitride or the like can be used to form the first conductive film 225.

Figure 2B:
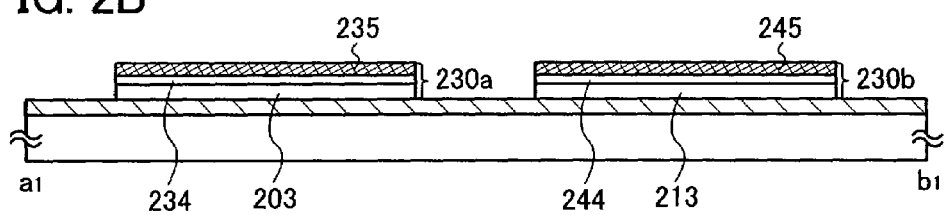
Figure 4B:
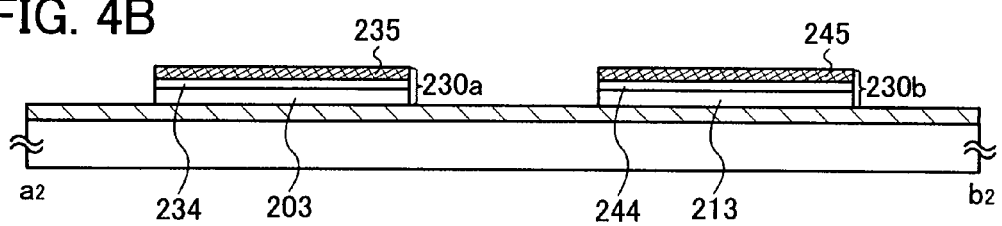

Next, a stacked body 220 in which the semiconductor film 223, the gate insulating film 224 and the conductive film 225 are sequentially stacked is selectively etched to form island-shaped stacked bodies 230a, 230b (FIGS. 2B and 4B). The stacked body 230a includes a stacked structure in which the semiconductor film 203, the gate insulating film 234 and the first conductive film 235 are sequentially stacked, and the stacked body 230b includes a stacked structure in which the semiconductor film 213, the gate insulating film 244 and the first conductive film 245 are sequentially stacked.

Figure 2C:
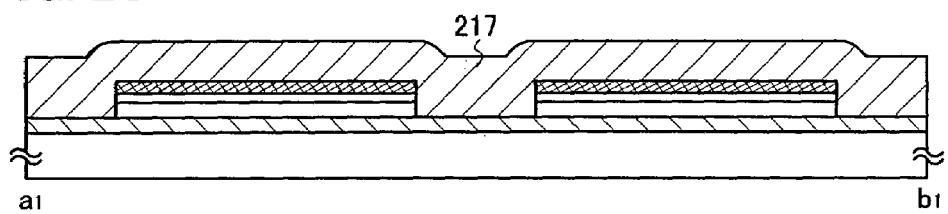
Figure 4C:
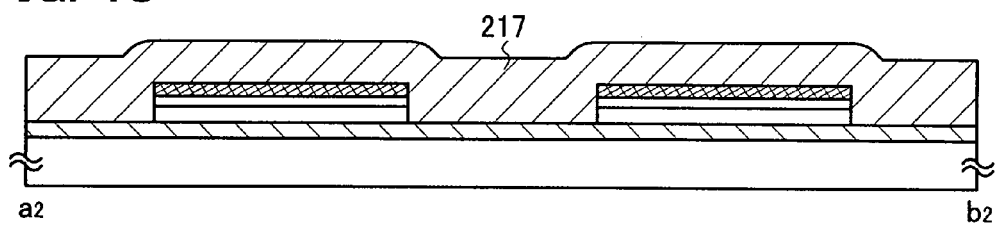

Next, an insulating film 217 is formed so as to cover the stacked bodies 230a, 230b (FIGS. 2C, 4C).

The insulating film 217 is formed by a CVD method, a sputtering method, or the like using silicon oxide, silicon oxynitride, silicon nitride oxide, diamond like carbon (DLC), or the like. Alternatively, the insulating film 217 can be formed with a single layer structure or a stacked structure including an organic material such as polyimide, polyamide, polyvinyl phenol, benzocyclobutene, acrylic, or epoxy; a siloxane material such as a siloxane resin; an oxazole resin; and/or the like formed by a spin coating method, a droplet discharging method, a screen printing method or the like. It is to be noted that a siloxane material corresponds to a material including a Si—O—Si bond. Siloxane is a material having a skeletal structure with the bond of silicon (Si) and oxygen (O). As a substituent, an organic group containing at least hydrogen (e.g., an alkyl group or aromatic hydrocarbon) is used. Alternatively, a fluoro group can be used as the substituent, or both a fluoro group and an organic group containing at least hydrogen can be used as the substituent. An oxazole resin includes, for example, photosensitive polybenzoxazole and the like. Photosensitive polybenzoxazole is a material having a low dielectric constant (dielectric constant of 2.9 at 1 MHz at room temperature), high heat resistance (thermal decomposition temperature of 550° C. with a temperature rise of 5° C./min by TGA (Thermal Gravity Analysis)), and a low water absorbing rate (0.3% at room temperature for 24 hours). An oxazole resin has a lower relative dielectric constant (approximately 2.9) as compared with a relative dielectric constant of polyimide or the like (approximately 3.2 to 3.4). Therefore, generation of parasitic capacitance can be suppressed and high-speed operation can be performed. Here, as the insulating film 217, silicon oxide, silicon oxynitride (SiOxNy) (x>y>0), or silicon nitride oxide (SiNxOy) (x>y>0) is formed by a CVD method as a single layer structure or a stacked structure. Further, the insulating film 217 may be formed as a stacked layer of an organic material such as polyimide, polyamide, polyvinyl phenol, benzocyclobutene, acrylic, or epoxy; a siloxane material such as a siloxane resin; or an oxazole resin.

Figure 2D:
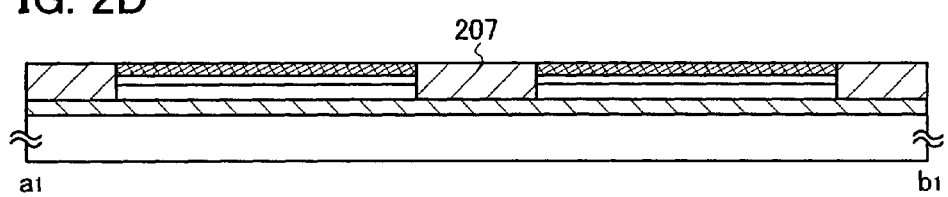
Figure 4D:
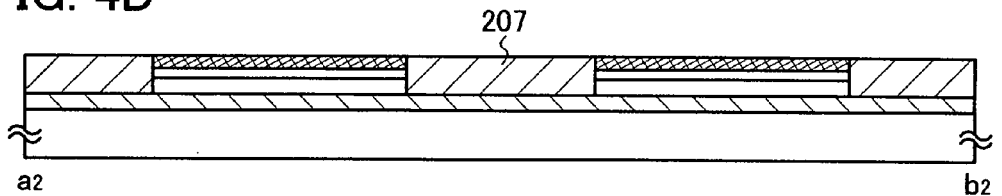

Then, the insulating film 217 is selectively removed such that a part thereof is left, thereby exposing surfaces of the first conductive films 235, 245 (FIG. 2D, 4D). Note that the left portion of the insulating film 217 is referred to as an insulating film 207 here. In addition, the insulating film 217 is removed so that the surfaces of the first conductive films 235, 245 are exposed, preferably, so that the surfaces of the first conductive films 235, 245 and the surface of the insulating film 207 which is left are at almost the same level in height. In that case, when a second conductive film 216 to be formed later crosses the stacked bodies 230a, 230b, disconnection of the second conductive film 216 can be prevented at end portions of the stacked bodies 230a, 230b.

As a method for removing the insulating film 217, dry etching or wet etching can be conducted. When the surface of the insulating film 217 is uneven, resist, an organic material such as polyimide, polyamide, polyvinylphenol, benzocyclobutene, acrylic, or epoxy, a siloxane material such as siloxane resin, an oxazole resin or the like is formed over the surface for planarization, and etching is conducted after the planarization. Thus, the level of the surfaces of the first conductive films 235, 245 can be aligned with the level of the surface of the insulating film 207. In that case, as a material formed over the surface of the insulating film 217, a material whose etching selectivity to an etchant is almost equal to that of the insulating film 217 is preferably used.

A grinding treatment, a polishing treatment, CMP (Chemical Mechanical Polishing), or the like may be conducted to remove the insulating film 217. As for the grinding treatment, a surface of an object to be treated (here, the insulating film 217) is ground and smoothed to expose the surfaces of the first conductive films 235, 245 using grains of a grinding stone. As for the polishing treatment, the surface of the object to be treated is smoothed by a plastic smoothing action or frictional polishing action using an abrasive agent such as abrasive-coated cloth and paper or abrasive grains.

When the insulating film 217 is removed, the first conductive films 234, 235 serve as stoppers, and thus, the gate insulating films 234, 244 can be prevented from being etched. In particular, when the gate insulating films 234, 244 and the insulating film, 217 are formed using the same material, the first conductive films 235, 245 effectively function as stoppers for etching.

In addition, the insulating film 217 is preferably removed to expose the entire surfaces of the first conductive films 235, 245; however, it may be removed so that at least parts of the first conductive films 235, 245 are exposed. This is because an electrical connection with the second conductive film 216 to be formed later is possible when at least parts of the first conductive films 235, 245 are exposed.

In addition, the surfaces of the first conductive films 235, 245 and the surface of the insulating film 207 are preferably at exactly the same level in height. However, if a level difference between the level of the surfaces of the first conductive films 235, 245 and the level of the surface of the insulating film 207 is smaller than the heights of the stacked bodies 230a, 230b, the level of the surface of the insulating film 207 may be higher or lower than the level of the surfaces of the first conductive films 235, 245. In that case, steps (level difference) at end portions of the stacked bodies 230a, 230b can be reduced.

Figure 2E:
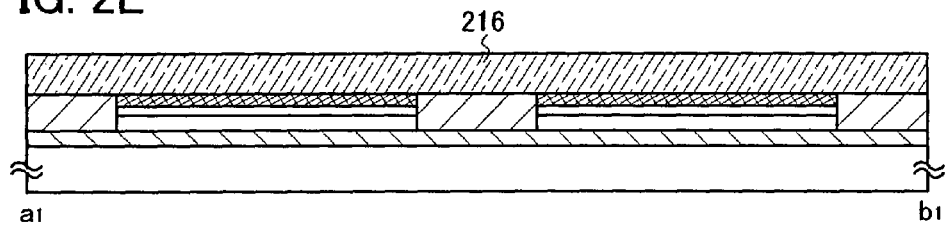
Figure 4E:
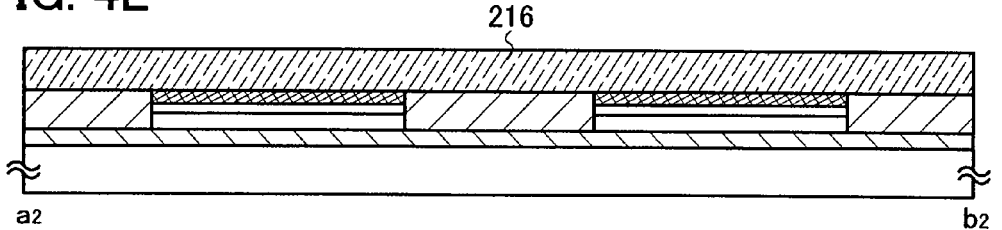

Then, the second conductive film 216 is formed over the first conductive films 235, 245 and the insulating film 207 (FIGS. 2E, 4E).

The second conductive film 216 can be formed, as a single layer structure or a stacked structure, using an element selected from tantalum (Ta), tungsten (W), titanium (Ti), molybdenum (Mo), aluminum (Al), copper (Cu), chromium (Cr), niobium (Nb), and the like; or an alloy material or a compound material containing the element as a main component. Alternatively, the second conductive film 216 can be formed using a semiconductor material typified by polycrystalline silicon doped with an impurity element such as phosphorus. The first conductive films 235, 245 and the second conductive film 216 may be formed using the same material or different materials. For example, as the conductive films 235, 245, tantalum nitride can be used, and as the second conductive film 216, tungsten can be used. Alternatively, titanium may be used for the first conductive films 235, 245 and a stacked structure of aluminum and titanium formed in this order may be used for the second conductive film 216.

Figure 3A:
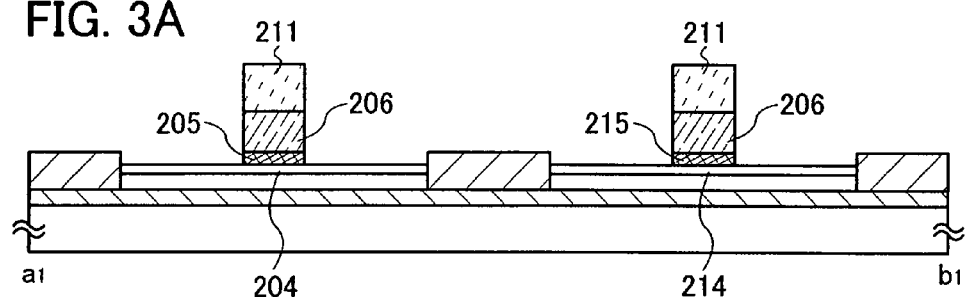
FIGS. 3A to 3C show an example of a manufacturing method of a semiconductor device according to an aspect of the present invention.
Figure 5A:
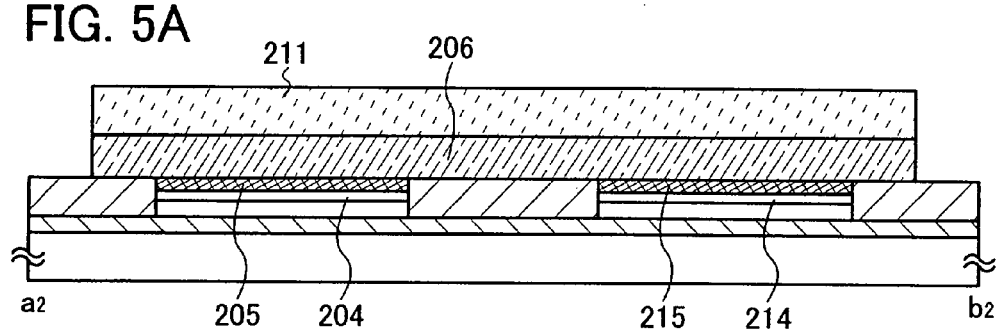
FIGS. 5A and 5B show an example of a manufacturing method of a semiconductor device according to an aspect of the present invention.

Then, a resist 211 is selectively formed over the second conductive film 216, and parts of the first conductive films 235, 245 and a part of the second conductive film 216 are selectively removed using the resist 211 as a mask, to form the first conductive films 205, 215 and the second conductive film 206 (FIGS. 3A and 5A). In addition, at that time, parts of the gate insulating films 204, 214 (a portion which is not covered with the resist 211) may also be selectively removed using the resist 211 as a mask, as well as the first conductive films 235, 245 and the second conductive film 216.

Figure 3B:
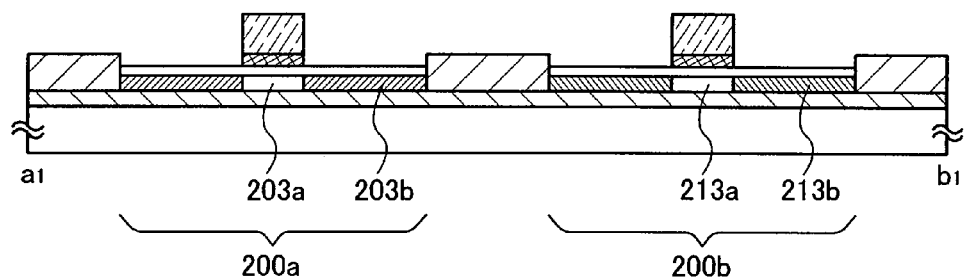

Then, an impurity element is added into the semiconductor films 203, 213 using the first conductive films 205, 215 and the second conductive film 206 as masks, so that impurity regions 203b are formed in the semiconductor film 203 and impurity regions 213b are formed in the semiconductor film 213 (FIG. 3B). The impurity regions 203b serve as source and drain regions in the thin film transistor 200a and the impurity regions 213b serve as source and drain regions in the thin film transistor 200b.

As the impurity element, an impurity element imparting an n-type conductivity or an impurity element imparting a p-type conductivity can be used. As the impurity element imparting an n-type conductivity, phosphorus (P), arsenic (As), or the like can be used. As the impurity element imparting a p-type conductivity, boron (B), aluminum (Al), gallium (Ga), or the like can be used. For example, phosphorus (P) is added to the semiconductor film 203 at a concentration of $1 \times 10^{19}$ to $1 \times 10^{20}/cm^3$ to form the n-type impurity regions 203b, and, boron (B) is added to the semiconductor film 213 at a concentration of $1 \times 10^{19}/cm^3$ to $1 \times 10^{20}/cm^3$ to form the p-type impurity regions 213b.

Figure 3C:
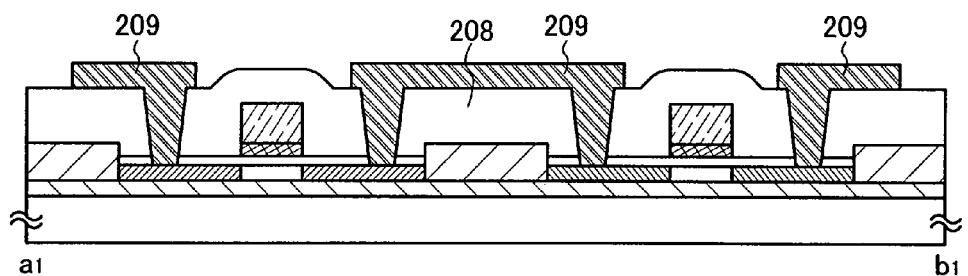
Figure 5B:
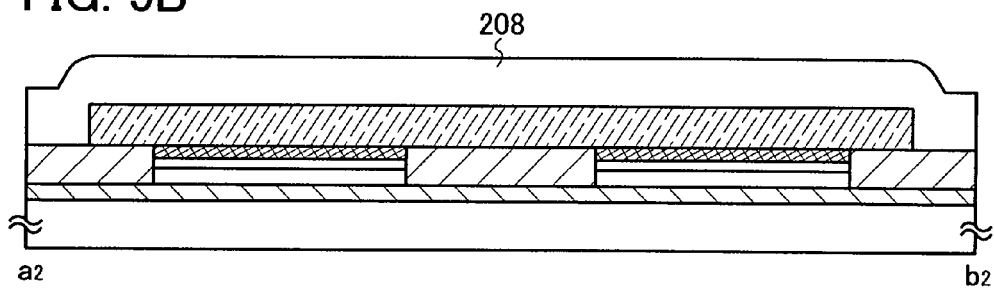

Then, an insulating film 208 is formed to cover the second conductive film 206, the gate insulating films 204, 214 and the like, and a conductive film 209 serving as source and drain electrodes is selectively formed over the insulating film 208 (FIGS. 3C, 5B). The conductive film 209 is formed such that the conductive film 209 is electrically connected to the impurity regions 203b, 213b serving as source and drain regions of the semiconductor films 203, 213.

The insulating film 208 is formed by a CVD method, a sputtering method, or the like using silicon oxide, silicon oxynitride ($SiO_xN_y$) (x>y>0), silicon nitride oxide ($SiN_xO_y$) (x>y>0), or the like. Alternatively, the insulating film 208 can be formed to have a single layer structure or a stacked structure including an organic material such as polyimide, polyamide, polyvinyl phenol, benzocyclobutene, acrylic, or epoxy; a siloxane material such as a siloxane resin; an oxazole resin; and the like. Here, as the insulating film 208, silicon oxide, silicon oxynitride ($SiOxNy$) (x>y>0), or silicon nitride oxide ($SiNxOy$) (x>y>0) is formed by a CVD method as a single layer structure or a stacked structure. Further, the insulating film 208 may be formed as a stacked layer of an organic material such as polyimide, polyamide, polyvinyl phenol, benzocyclobutene, acrylic, or epoxy; a siloxane material such as a siloxane resin; or an oxazole resin.

The conductive film 209 can be formed with a single layer structure or a stacked structure using one kind of a metal selected from aluminum, tungsten, titanium, tantalum, molybdenum, nickel, neodymium, and the like; or an alloy containing a plurality of the elements. For example, as a conductive film formed using an alloy containing a plurality of the elements, an aluminum alloy containing titanium, an aluminum alloy containing neodymium, or the like can be used. In a case where the conductive film 209 is provided with a stacked structure, for example, a stacked structure in which an aluminum layer or an aluminum alloy layer as described above is interposed between titanium layers may be employed.

Through the above steps, the semiconductor device shown in FIGS. 1A to 1C can be manufactured. Note that the semiconductor device shown in FIGS. 1A to 1C shows a case where a part of the gate insulating film 204 is removed using the resist 211 as a mask in FIG. 3A.

This embodiment mode has shown the example in which a thin film transistor is used as a transistor; however, the present invention is not limited to this example and various types of transistors can be applied. Thus, there is no particular limitation on the applicable transistors. Accordingly, without being limited to thin film transistors (TFTs) using a non-single crystal semiconductor film typified by amorphous silicon or polycrystalline silicon, transistors formed using a semiconductor substrate or an SOI substrate, MOS transistors, junction type transistors, bipolar transistors, transistors using compound semiconductor such as ZnO, or a-InGaZnO, transistors using an organic semiconductor or a carbon nanotube, and other transistors can be applied. Note that hydrogen or halogen may be contained in such a non-single crystal semiconductor film.

In addition, a structure of the transistor used in the present invention can have various modes, and it is not limited to a particular structure. For example, a multigate structure having two or more gates may be employed. By employing a multigate structure, reduction in off current, and reliability improvement by increase in withstand voltage of a transistor can be obtained, and flat characteristics with almost no changes of current between a drain and a source can be obtained even when a voltage between the drain and the source changes in an operation of a saturated region. In addition, an LDD region may be provided. By employing an LDD region, reduction in off current, and ability improvement by increase in withstand voltage of a transistor can be obtained, and flat characteristics with almost no changes of current between a drain and a source can be obtained even when a voltage between the drain and the source changes in the operation of the saturated region.

This embodiment mode can be freely combined with any of the structures of the semiconductor devices shown in the other embodiment modes described in this specification.

Embodiment Mode 2

Embodiment Mode 2 will describe a semiconductor device and a manufacturing method thereof, which is different from those of the above embodiment mode, with reference to drawings. Specifically, a structure in which a sidewall is provided in the semiconductor device shown in the above embodiment mode is described.

A manufacturing method of a semiconductor device when an insulating film (hereinafter, referred to as a sidewall) is provided for the thin film transistor shown in the above embodiment mode is described with reference to FIGS. 6A to 6E. FIGS. 6A to 6E are cross sectional views taken along the line $a_1$ to $b_1$ in FIG. 1A.

Figure 6A:
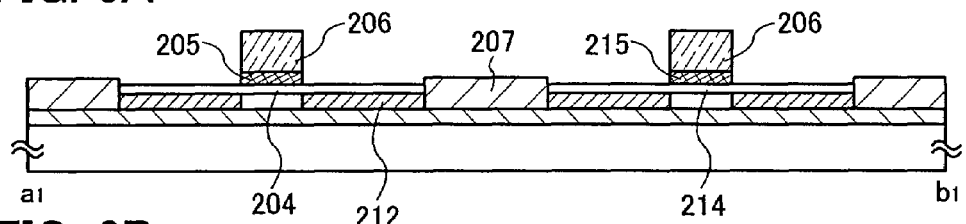
FIGS. 6A to 6E show an example of a manufacturing method of a semiconductor device according to an aspect of the present invention.

The modes shown in FIGS. 3A and 5A are obtained similarly first, and then, an impurity element is added to the semiconductor films 203, 213 using the second conductive film 206 as a mask, to form impurity regions 212 (FIG. 6A). As the impurity element, an impurity element imparting an n-type conductivity or an impurity element imparting a p-type conductivity can be used. As the impurity element imparting an n-type conductivity, phosphorus (P), arsenic (As), or the like can be used. As the impurity element imparting a p-type conductivity, boron (B), aluminum (Al), gallium (Ga), or the like can be used. Here, phosphorus (P) is added to the semiconductor films 203, 213 at a concentration of $1\times10^{15}$ to $1\times10^{19}/cm^3$ to form the n-type impurity regions 212.

Figure 6B:
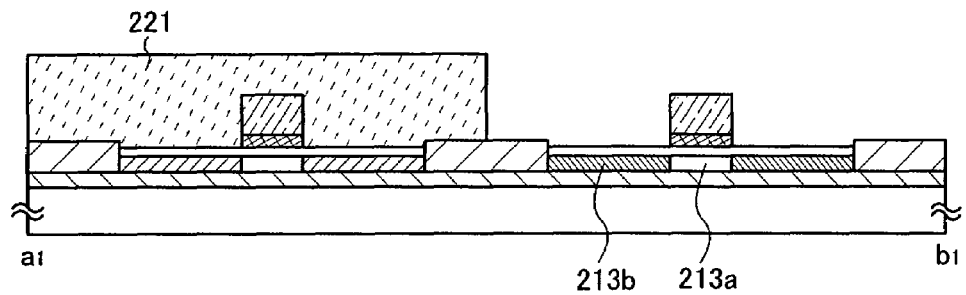

Then, a resist 221 is formed to cover the semiconductor film 203, and an impurity element is added to the semiconductor film 213 using the second conductive film 206 as a mask to form the impurity regions 213b (FIG. 6B). As the impurity element, an impurity element imparting an n-type conductivity or an impurity element imparting a p-type conductivity, can be added at a higher concentration than that of the impurity element which has been added in FIG. 6A. Here, boron (B) is added to the semiconductor film 213 at a concentration of $1\times10^{19}/cm^3$ to $1\times10^{20}/cm^3$ to form the p-type impurity regions 213b. As a result, the channel forming region 213a, and impurity regions 213b serving as source and drain regions are formed in the semiconductor film 213.

Figure 6C:
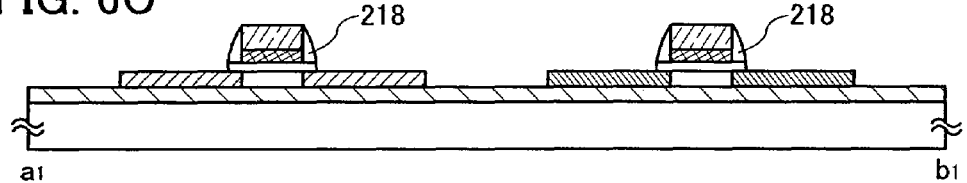

Then, an insulating film (sidewall 218) is formed so as to be in contact with the side faces of the first conductive films 205, 215 and the second conductive film 206 (FIG. 6C).

As a manufacturing method of the sidewall 218, a film including an inorganic material such as silicon, silicon oxide, silicon nitride, or a film including an organic material such as organic resin is formed to cover the gate insulating films 204, 214 and the second conductive film 206 as a single layer or a stacked layer by a plasma CVD method, a sputtering method or the like. Then, the insulating film is selectively etched by anisotropic etching which is conducted mainly in the perpendicular direction to form the sidewall 218 which is in contact with the side faces of the first conductive films 205, 215 and the second conductive film 206. Note that there is a case where parts of the gate insulating films 204, 214 or a part of the insulating film 207 is/are etched at the same time when the sidewall 218 is formed (FIG. 6C). Parts of the gate insulating films 204, 214 are removed, and the left portion of the gate insulating films 204, 214 are formed below the first conductive films 205, 215 and the sidewall 218. A part of the insulating film 207 is removed, and thus, the left portion of the gate insulating film 207 is below the second conductive film 206 and the sidewall 218.

Figure 6D:
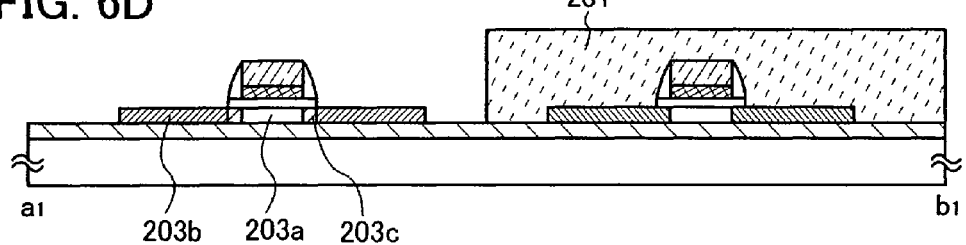

Then, a resist 231 is formed to cover the semiconductor film 213, and an impurity element is added to the semiconductor film 203 using the second conductive film 206 and the sidewall 218 as masks to form the impurity regions 203b (FIG. 6D). As the impurity element, an impurity element imparting an n-type conductivity or an impurity element imparting a p-type conductivity at a higher concentration than that of the impurity element which has been added in FIG. 6A can be used. Here, phosphorus (P) is added to the semiconductor film 203 at a concentration of $1\times10^{19}/cm^3$ to $1\times10^{20}/cm^3$ to form the n-type impurity regions 203b. As a result, the channel forming region 203a, the impurity regions 203b serving as source and drain regions, and the impurity regions 203c serving as LDD regions are formed in the semiconductor film 203.

Figure 6E:
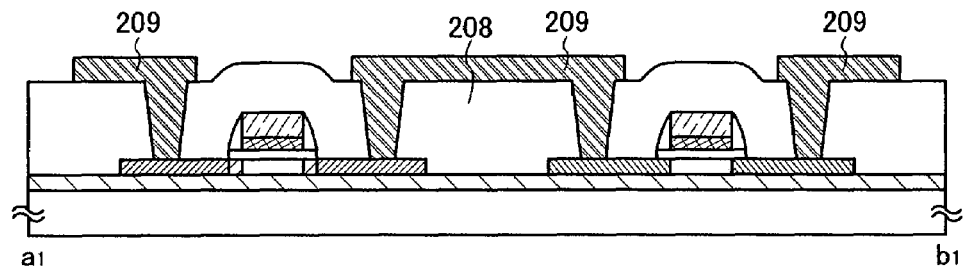

Then, the insulating film 208 is formed to cover the second conductive film 206, the gate insulating films 204, 214, the sidewall 218 and/or the like, and the conductive film 209 serving as source and drain electrodes is selectively formed over the insulting film 208 (FIG. 6E). The conductive film 209 is formed to be electrically connected to the impurity regions 203b, 213b serving as source and drain regions in the semiconductor films 203, 213.

Through the above steps, a semiconductor device having a sidewall can be manufactured.

This embodiment mode has shown the structure in which the LDD region is formed in the semiconductor film 203 included in the n-channel thin film transistor 200a, and no LDD region is formed by design in the semiconductor film 213 included in the p-channel thin film transistor 200b; however, the present invention is not limited to this structure, and an LDD region may be formed in each of the semiconductor film 203 and the semiconductor film 213.

This embodiment mode can be freely combined with any of the other embodiment modes in this specification.

Embodiment Mode 3

Embodiment Mode 3 will describe a semiconductor device and a manufacturing method thereof, which are different from those of the above embodiment modes, with reference to drawings. Specifically, a structure in which an impurity region having a different conductivity type from that of impurity regions serving as source and drain regions is formed to be in contact with the impurity regions serving as the source and drain regions in the semiconductor film of the semiconductor device shown in the above embodiment mode, is described.

Figure 7A:
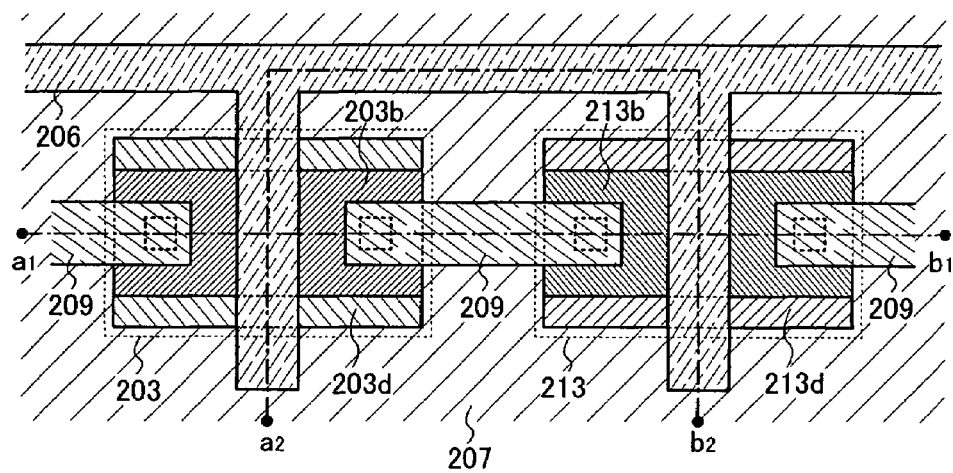
FIGS. 7A to 7C show an example of a semiconductor device according to an aspect of the present invention.
Figure 7B:
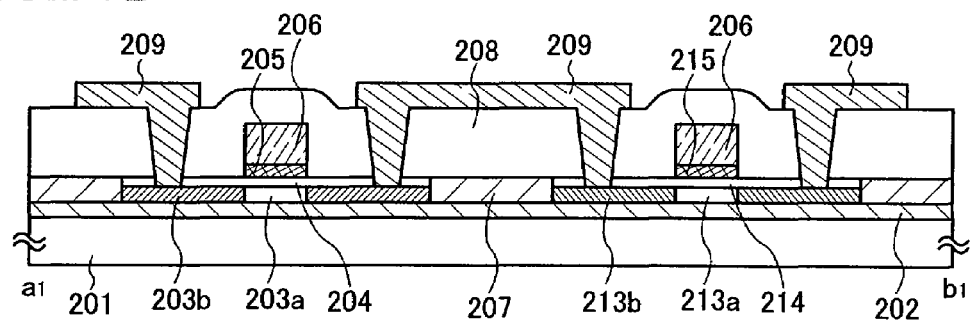
Figure 7C:
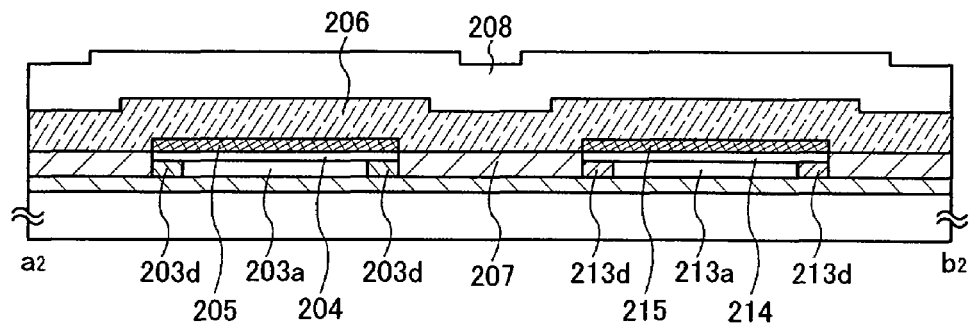

An example of a semiconductor device shown in this embodiment mode is described with reference to FIGS. 7A to 7C. FIG. 7A is a top view of a semiconductor device shown in this embodiment mode, FIG. 7B is a cross sectional view taken along the line $a_1$-$b_1$ of FIG. 7A, and FIG. 7C is a cross sectional view taken along the line $a_2$-$b_2$ of FIG. 7A.

The semiconductor device shown in this embodiment mode includes impurity regions 203d, 213d which are provided at end portions of the semiconductor films 203, 213. The impurity regions 203d, 213d may be provided at end portions of the semiconductor films 203, 213 which overlap with the second conductive film 206 serving as a gate electrode and a gate wiring and/or in a vicinity thereof. The impurity regions 203d, 213d are formed so as to have a different conductivity from that of the impurity regions 203b, 213b serving as source and drain regions in the semiconductor films 203, 213.

For example, when the impurity regions 203b serving as source and drain regions in the semiconductor film 203 have an n-type conductivity, the impurity regions 203d provided at the end portion of the semiconductor film 203 are formed so as to have a p-type conductivity. Alternatively, when the impurity regions 213b serving as source and drain regions in the semiconductor film 213 have a p-type conductivity, the impurity regions 213d provided at the end portions of the semiconductor film 213 are formed so as to have an n-type conductivity. In that case, the impurity regions 203d, 213d may be provided in one or both of the semiconductor films 203, 213.

Note that "at the end portions of the semiconductor films 203, 213 which overlap with the second conductive film 206 and/or in a vicinity thereof" indicates a region which is at end portions of the semiconductor films 203, 213 and overlaps with the second conductive film 206, and in the vicinity of the overlapping region, or a region which is at end portions of the semiconductor films 203, 213 and in the vicinity of the overlapping region (not including the region overlapping with the second conductive film 206). For example, when the impurity regions 203d, 213d are formed in a region which is at the end portions of the semiconductor films 203, 213 and overlaps with the second conductive film 206 and in the vicinity of the overlapping region, an impurity element is preferably added to the semiconductor films 203, 213 before forming the first conductive film 205. On the other hand, when the impurity regions 203d, 213d are formed in the vicinity of the region which is at the end portions of the semiconductor films 203, 213 and which overlaps with the second conductive film 206, an impurity element can be added to the semiconductor films 203, 213 after forming the second conductive film 206.

In this manner, by providing the impurity regions 203d, 213d having a conductivity type different from that of the impurity regions 203b, 213b, at the end portions of the semiconductor films 203, 213 which overlaps with the second conductive film 206, the junction between the impurity regions 203b, 213b and the impurity regions 203d, 213d is p-n junction, thereby increasing resistance. As a result, influence of the characteristics of the channel forming regions which overlaps with the second conductive film 206 and which are at the end portions of the semiconductor films 203, 213 to characteristics of the whole transistor can be reduced.

Figure 8A:
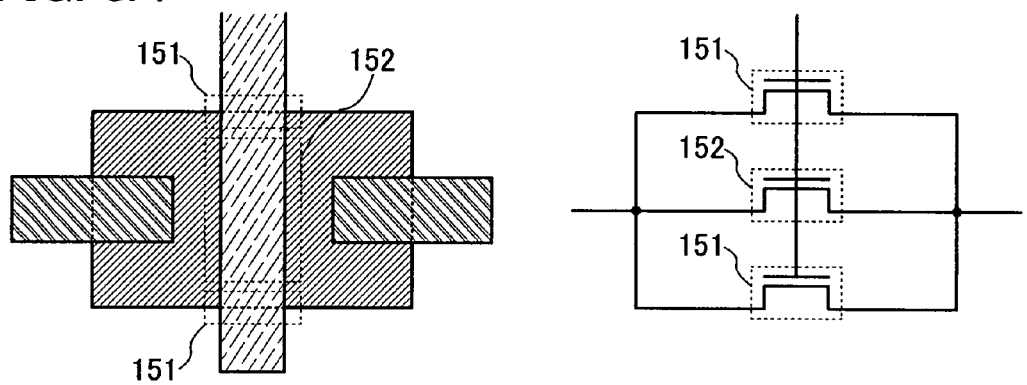
FIGS. 8A and 8B each show an example of a semiconductor device according to an aspect of the present invention.

In the conventional thin film transistors, there is a case where defective coverage of the gate insulting film is caused or charges are accumulated along with the manufacturing process at the end portions of the semiconductor film overlapping the conductive film. Thus, a transistor 151 having a channel forming region at end portions of the semiconductor films 203, 213 (also referred to as an edge transistor 151) and a transistor 152 having a channel forming region at center portions of the semiconductor films 203, 213 (also referred to as a main transistor 152) are connected to each other in parallel, which is regarded as one transistor. Accordingly, the equivalent circuit is shown in FIG. 8A, and the characteristics of the all transistors (the edge transistor 151 and the main transistor 152) may be influenced by not only the characteristic of the main transistor 152 but also the characteristic of the edge transistor 151.

Figure 8B:
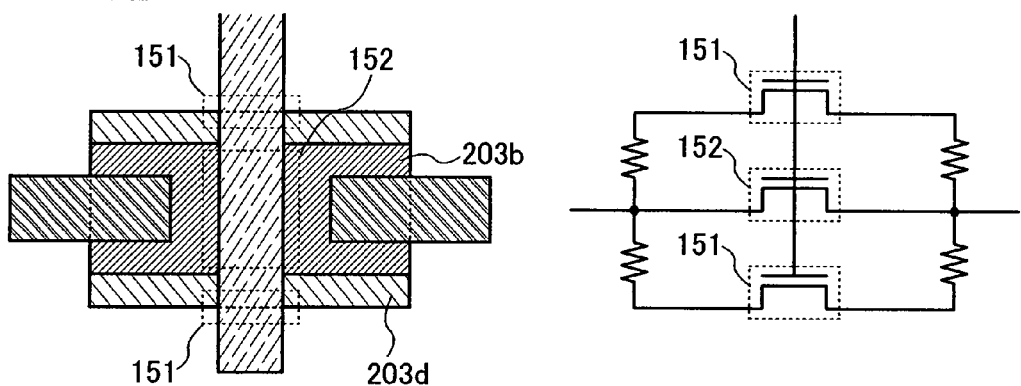

On the other hand, the structure shown in this embodiment mode can be regarded as the structure in which the main transistor 152 and the edge transistor 151 are connected in parallel. However, by providing the impurity regions 203d, 213d, the equivalent circuit shown in FIG. 8B can be obtained. The resistance between the impurity regions 203b, 213b and the impurity regions 203d, 213d can be increased, and thus, the influence of the characteristic of the edge transistor 151 to the characteristics of the whole transistor can be reduced.

In particular, in the semiconductor device of the present invention, when a part of the insulating film 217 is removed to expose the surface of the first conductive films 235, 245 after forming the insulating film 217, there is a case where the level of the surface of the left insulating film 207 may be lower than that of the gate insulating films 204, 214. In that case, since the second conductive film 216 to be formed later is in contact with side faces of the first conductive films 205, 215 and the gate insulating films 204, 214, there is a risk that short circuit or the like is caused between the semiconductor films 203, 213 and the second conductive film 216. Even in that case, by employing the structure shown in this embodiment mode, a problem of short circuit or the like at the end portions of the semiconductor films 203, 213 can be suppressed.

This embodiment mode can be freely combined with any of the other embodiment modes in this specification. For example, the sidewall shown in Embodiment Mode 2 can be provided for the structure shown in this embodiment mode.

Embodiment Mode 4

Embodiment Mode 4 will describe a semiconductor device and a manufacturing method thereof, which is different from those of the above embodiment modes, with reference to drawings. Specifically, elements in the semiconductor device, such as a nonvolatile memory element for forming a memory portion, a transistor controlling the memory element and the like are described.

Figure 9:
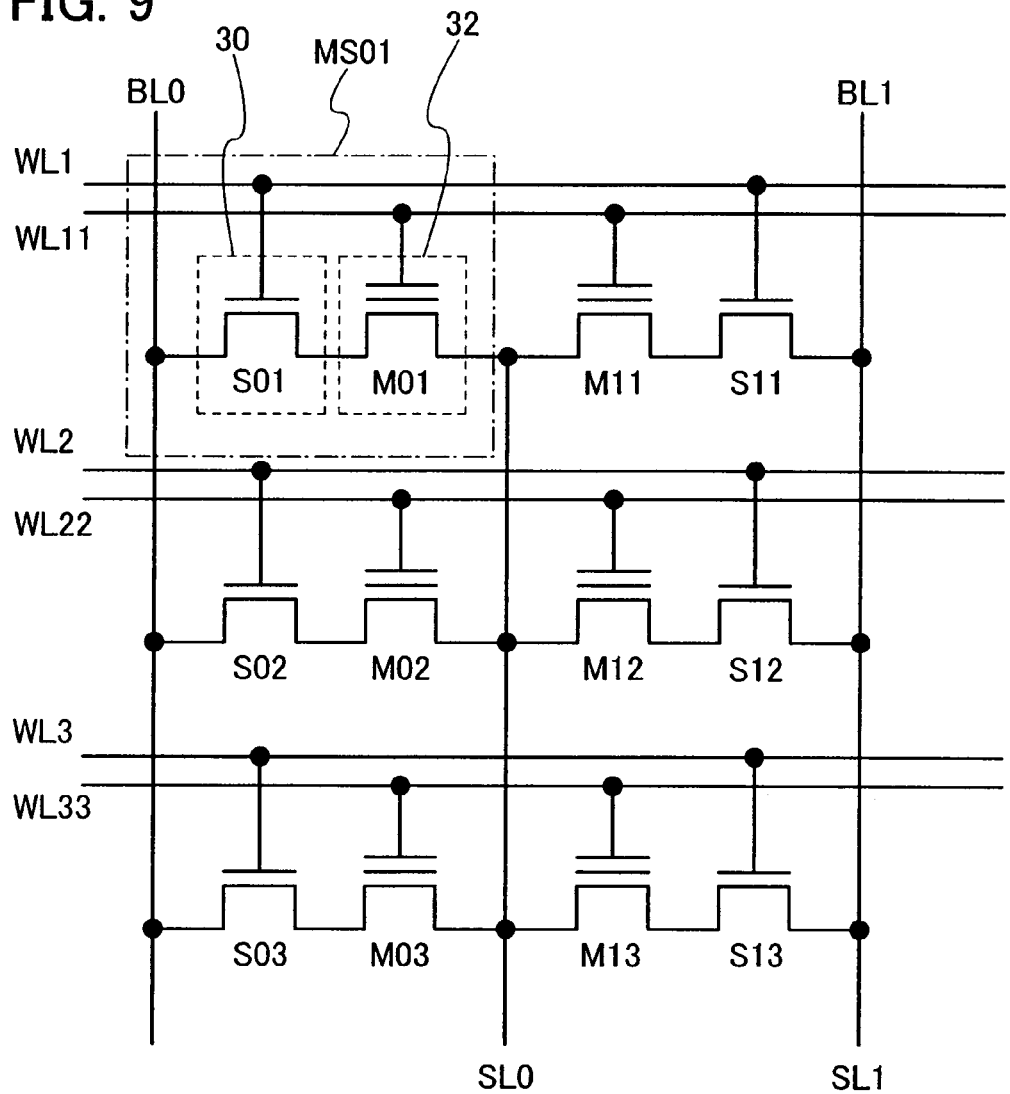
FIG. 9 shows an example of a memory portion included in a semiconductor device according to an aspect of the present invention.
Figure 9:
Figure 9:
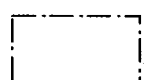

First, an example of a memory portion in the nonvolatile semiconductor memory device is shown in FIG. 9.

In the memory portion shown in FIG. 9, a plurality of memory cells each including a controlling transistor S and a nonvolatile memory element M are provided. In FIG. 9, one memory cell includes a controlling transistor S01 and a nonvolatile memory element M01. Similarly, a memory cell includes a controlling transistor S02 and a nonvolatile memory element M02, a memory cell includes a controlling transistor S03 and a nonvolatile memory element M03, a memory cell includes a controlling transistor S11 and a nonvolatile memory element M11, a memory cell includes a controlling transistor S12 and a nonvolatile memory element M12, and a memory cell includes a controlling transistor S13 and a nonvolatile memory element M13.

A gate electrode of the controlling transistor S01 is connected to a word line WL1, one of a source and a drain thereof is connected to a bit line BL0, and the other of the source and the drain is connected to a source or a drain of the nonvolatile memory element M01. A gate electrode of the nonvolatile memory element M01 is connected to a word line WL11, the one of the source and the drain is connected to the source or drain of the controlling transistor S01, and the other of the source and the drain thereof is connected to a source line SL0.

Figure 22:
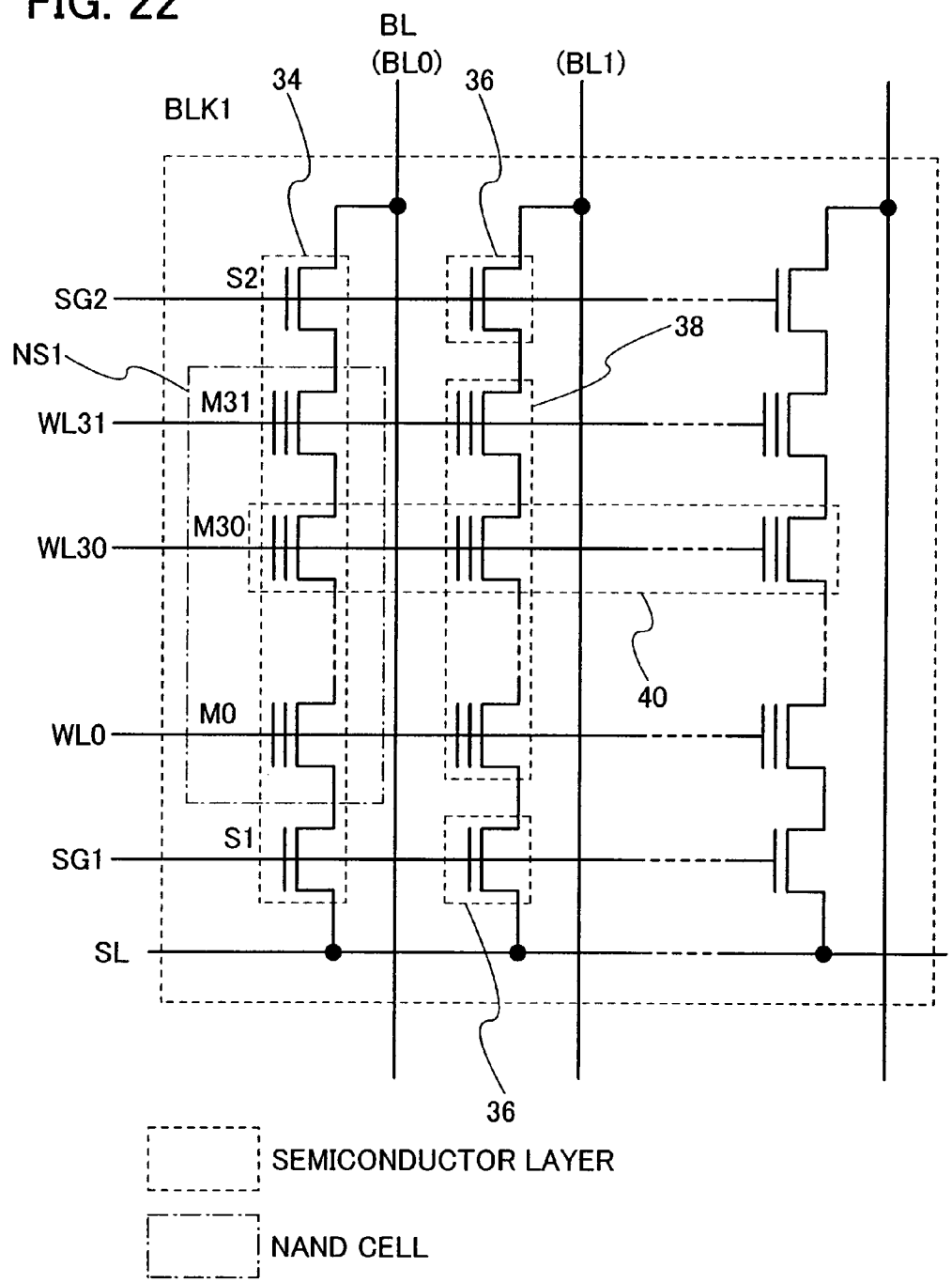
FIG. 22 shows an example of a memory portion included in a semiconductor device according to an aspect of the present invention.

The nonvolatile memory element provided in the memory portion may be a NAND type as shown in FIG. 22.

In an equivalent circuit of the NAND type memory cell array shown in FIG. 22, a NAND cell NS1 in which a plurality of nonvolatile memory elements are connected in series is connected to a bit line BL. A plurality of NAND cells forms a block BLK together. The number of word lines in a block BLK1 shown in FIG. 22 is 32 (word lines WL0 to WL31). Nonvolatile memory elements positioned in the same row of the block BLK1 are connected to a word line corresponding to the row in common.

In this case, selection transistors S1 and S2 and nonvolatile memory elements MO to M31 are connected in series. These selection transistors and the nonvolatile memory elements may be recognized as one unit and formed using one semiconductor layer 34 in common. Accordingly, a wiring connecting the nonvolatile memory elements can be omitted, and integration can be attempted. Further, separation between adjacent NAND cells can be easily performed. Semiconductor layers 36 of the selection transistors S1 and S2 and a semiconductor layer 38 of the NAND cell may be formed to be separated. When erasing operation in which electric charges are drawn from floating gates of the nonvolatile memory elements M0 to M31 is performed, the erasing operation can be performed by a unit of the NAND cell. Further, nonvolatile memory elements connected to one word line (for example, nonvolatile memory elements in a row of M30) in common may be formed using one semiconductor layer 40.

Further, the nonvolatile memory element provided in the memory portion may be an AND type as shown in FIG. 23.

In an equivalent circuit of the AND type memory cell array shown in FIG. 23, a AND cell AS1 in which a plurality of nonvolatile memory elements are connected in parallel is connected to a bit line BL. A plurality of AND cells forms a block BLK together. The number of word lines in a block BLK1 shown in FIG. 23 is 128 (word lines WL0 to WL127). Nonvolatile memory elements positioned in the same row of the block BLK1 are connected to a word line corresponding to the row in common.

In this case, selection transistors S1 and S2 and nonvolatile memory elements M0 to M127 are connected in parallel. Specifically, a main bit line BL and a sub bit line BL' are provided, and an array structure in which each nonvolatile memory element is connected to the sub bit line BL' in parallel is adopted, and thus, erasing per word line WL is possible.

Miniaturization of a memory cell can be given as an advantage of the NAND type, while as an advantage of the AND type, easy introduction of a multi-value technology can be given. Needless to say, the nonvolatile memory element provided in the memory portion shown in this embodiment mode may be a NAND type or an AND type.

Figure 12:
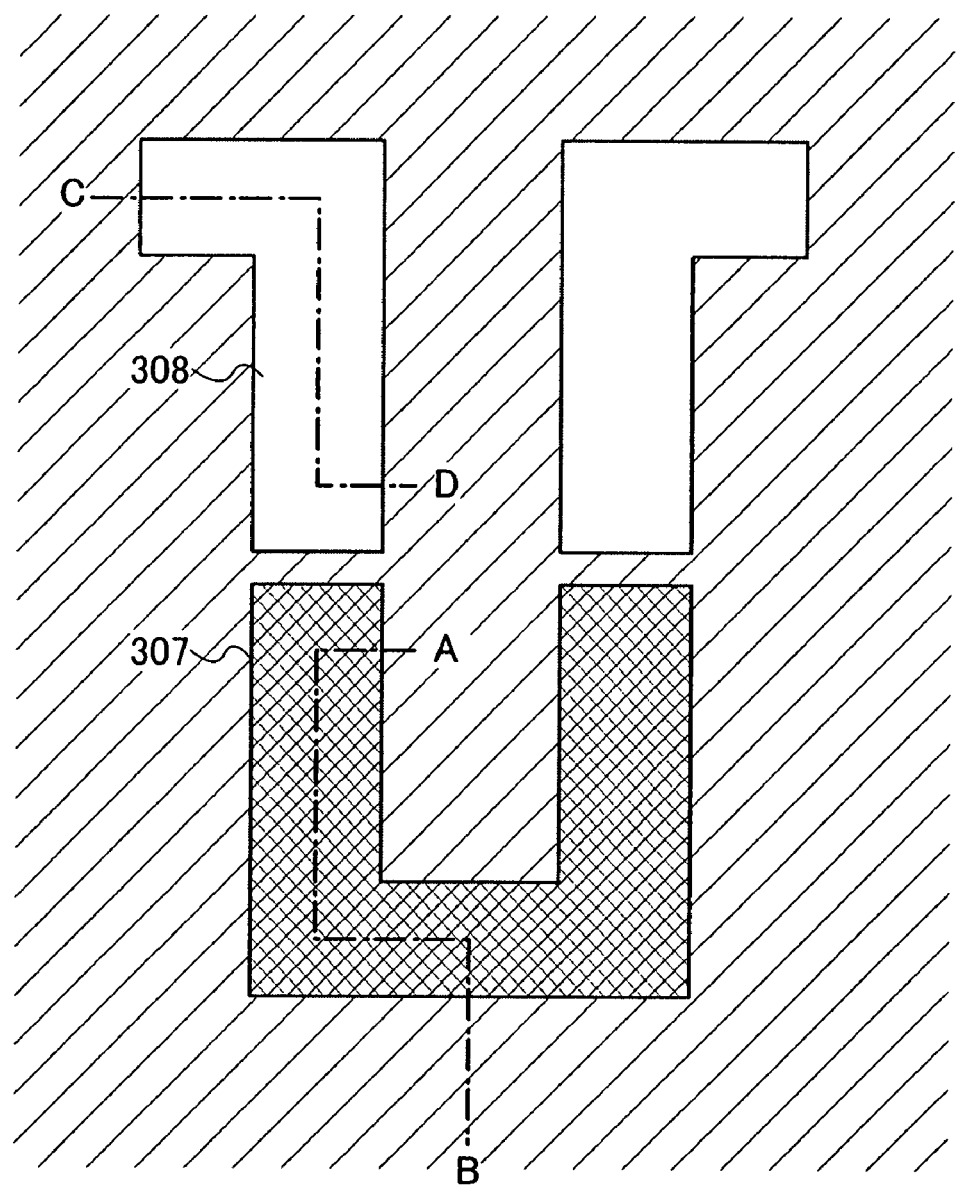
FIG. 12 shows an example of a manufacturing method of a semiconductor device according to an aspect of the present invention.
Figure 13:
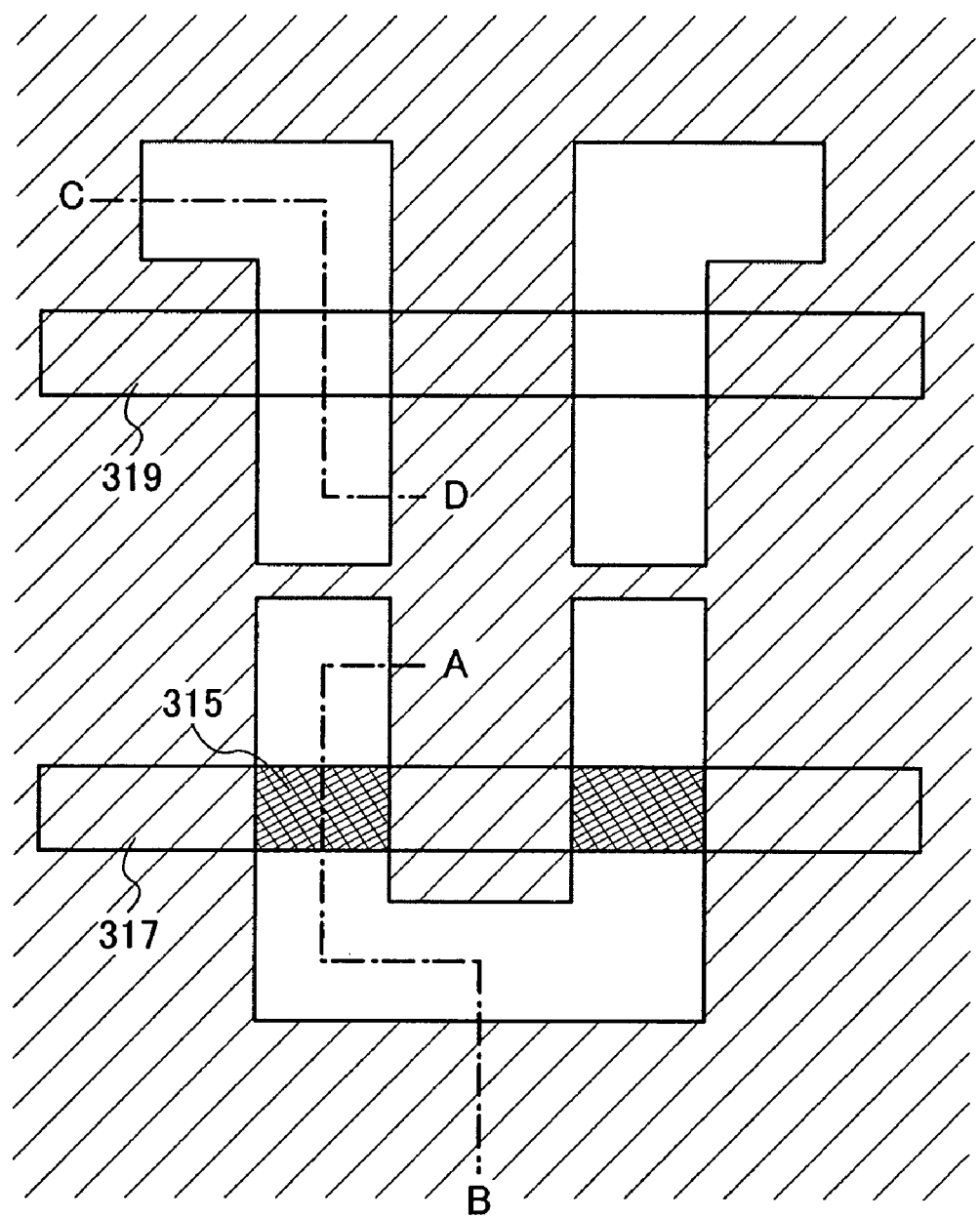
FIG. 13 shows a usage example of a semiconductor device according to an aspect of the present invention.
Figure 14:
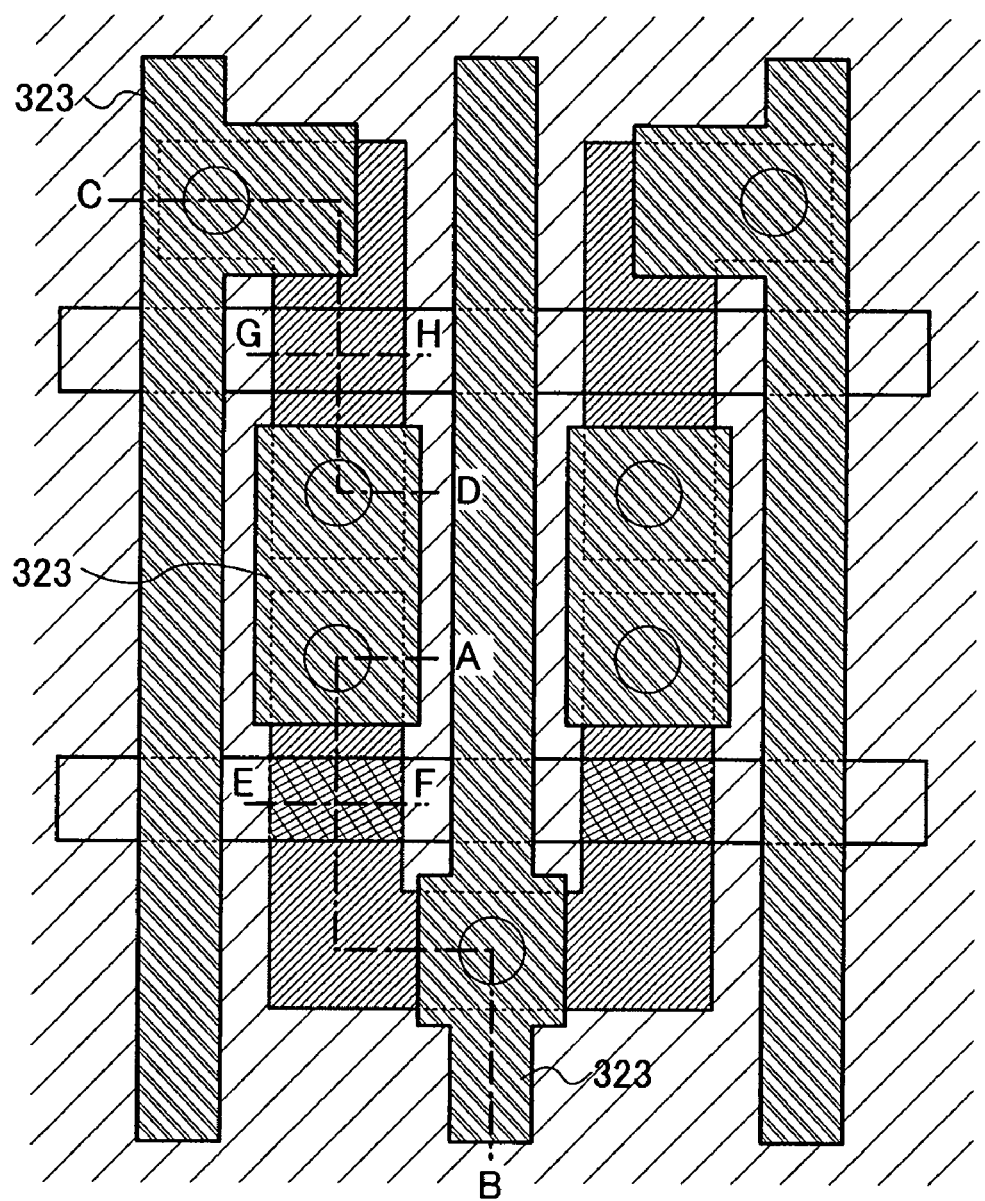
FIG. 14 shows a usage example of a semiconductor device according to an aspect of the present invention.

Next, a case where a nonvolatile memory element and a thin film transistor are formed at the same time is described with reference to drawings. FIGS. 12 to 14 are top views and FIGS. 10A to 10E, 11A to 11D and 20A to 20D are cross sectional views taken along the lines A-B and C-D in FIGS. 12 to 14. In addition, FIGS. 21A and 21B are cross sectional views taken along the lines E-F and G-H in FIG. 14. This embodiment mode shows a case where charge accumulation of a nonvolatile memory element between A-B is made by electrons and a thin film transistor between C-D is an n-channel transistor; however, the present invention is not limited to this case.

Figure 10A:
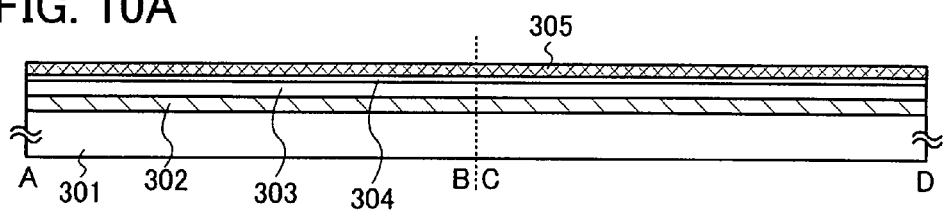
FIGS. 10A to 10E show an example of a manufacturing method of a semiconductor device according to an aspect of the present invention.

A semiconductor film 303 is formed first over a substrate 301 with an insulating film 302 interposed therebetween, and a first insulating film 304 and a charge accumulation layer 305 are stacked over the semiconductor film 303 (FIG. 10A).

The substrate 301 may be a glass substrate, a quartz substrate, a ceramic substrate, a metal substrate (for example, a stainless steel substrate or the like) or a semiconductor substrate such as Si substrate or the like. In addition, a plastic substrate can be used, such as polyethylene terephthalate (PET), polyethylene naphthalate (PEN), polyether sulfone (PES), or acrylic.

The insulating film 302 is formed by a CVD method or a sputtering method, using an insulating material such as silicon oxide, silicon nitride, silicon oxynitride (SiOxNy), (x>y>0), or silicon nitride oxide (SiNxOy) (x>y>0). For example, when the insulating film 302 is formed as a two-layer structure, it is preferable to form a silicon nitride oxide film as the first layer insulating film, and form a silicon oxynitride film as the second layer insulating film. Alternatively, a silicon nitride film may be formed as the first layer insulating film and a silicon oxide film may be formed as the second layer insulating film. In this manner, formation of the insulating film 302 serving as a blocking layer can prevent adverse effects of alkaline metals such as Na or alkaline earth metals contained in the substrate 301 to elements formed thereover. In a case where quartz is used for the substrate 301, the insulating film 302 may be omitted.

The semiconductor film 303 is formed using an amorphous semiconductor film or a crystalline semiconductor film. The crystalline semiconductor film includes a film which is obtained by a step of crystallizing an amorphous semiconductor film formed over the insulating film 302 by a heat treatment or laser irradiation; a film which is obtained by a step of making a crystalline semiconductor film formed over the insulating film 302 amorphous, and then, recrystallizing the amorphous semiconductor film; and the like. The crystallization using a laser may be conducted by such a method as shown in Embodiment Mode 1.

A heat treatment, a plasma treatment or the like is conducted to the semiconductor film 303, thereby forming the first insulating film 304. For example, the semiconductor film 303 is subjected to an oxidation treatment, a nitridation treatment or an oxynitridation treatment by a high density plasma treatment. Thus, the first insulating film 304 which is an oxide film, a nitride film or an oxynitride film is formed over the semiconductor film 303. The first insulating film 304 may be formed of silicon oxide, silicon nitride, silicon oxynitiride, silicon nitride oxide or the like by a CVD method or a sputtering method, or a high plasma treatment may be conducted to such a film formed by a CVD method or a sputtering method to form the first insulating film 304.

For example, when the semiconductor film 303 is formed using a material containing Si as a main component, and an oxidation treatment or a nitridation treatment is conducted thereto by a high density plasma treatment, a silicon oxide (SiOx) film or a silicon nitride (SiNx) film is formed as the first insulating film 304. Alternatively, after conducting an oxidation treatment to the semiconductor film 303 by a high density plasma treatment, a high density plasma treatment may be conducted again as a nitridation treatment. At that time, a silicon oxide film is formed to be in contact with the semiconductor film 303, and a nitrogen plasma-treated layer having a high concentration of nitrogen is formed on the surface of the silicon oxide film or in the vicinity of the surface.

Here, the first insulating film 304 is formed to a thickness of 1 to 10 nm, preferably, 1 to 5 nm. For example, an oxidation treatment is conducted to the semiconductor film 303 by a high density plasma treatment to form a silicon oxide film with a thickness of about 3 nm on the surface of the semiconductor film 303, and then, a nitridation treatment is conducted by a high density plasma treatment to form a nitrogen plasma-treated layer on the surface of the silicon oxide film or in the vicinity of the surface. The semiconductor film 303 is subjected to high density plasma treatments under an oxygen atmosphere and a nitrogen atmosphere in turn so that a silicon oxide film with a thickness of about 3 nm can be formed and the silicon oxide film has a structure in which 20 to 50 atomic % of nitrogen is contained at depths of 0.25 to 0.75 nm. It is to be noted that the nitrogen plasma treated layer contains silicon containing oxygen and nitrogen (silicon oxynitride).

In addition, at that time, the oxidation treatment and the nitridation treatment by high density plasma treatments are preferably conducted continuously without being exposed to the air. By continuously conducting the high density plasma treatments, contaminants can be prevented from mixing in or production efficiency can be increased.

Note that in the case of oxidizing the semiconductor film by a high density plasma treatment, the high density plasma treatment is conducted under an atmosphere containing oxygen (e.g., an atmosphere containing oxygen ($O_2$) or dinitrogen monoxide ($N_2O$) and a rare gas (at least one of He, Ne, Ar, Kr, and Xe); or an atmosphere containing oxygen or dinitrogen monoxide, and hydrogen ($H_2$) and a rare gas). On the other hand, in the case of conducting nitriding the semiconductor film by a high density plasma treatment, the high density plasma treatment is conducted under a nitrogen atmosphere (e.g., an atmosphere containing nitrogen ($N_2$) and a rare gas (at least one of He, Ne, Ar, Kr, and Xe); an atmosphere containing nitrogen, hydrogen, and a rare gas; or an atmosphere containing $NH_3$ and a rare gas).

As the rare gas, Ar can be used, for example. Alternatively, a mixed gas of Ar and Kr may also be used. In the case of conducting a high density plasma treatment in a rare gas atmosphere, the first insulating film 304 may contain the rare gas used in the plasma treatment (at least one of He, Ne, Ar, Kr, and Xe). When Ar is used, the first insulating film 304 may contain Ar.

The conditions of the high density plasma treatment may be the conditions shown in the above embodiment modes. In this embodiment mode, in the case of oxidizing an objected to be treated by a high density plasma treatment, a mixed gas of oxygen ($O_2$), hydrogen ($H_2$), and argon (Ar) is introduced. The mixed gas used here may be introduced with an oxygen flow rate of 0.1 to 100 sccm, a hydrogen flow rate of 0.1 to 100 sccm, and an argon flow rate of 100 to 5000 sccm. Note that the mixed gas is preferably introduced with a ratio of oxygen:hydrogen:argon=1:1:100. For example, the mixed gas may be introduced with an oxygen flow rate of 5 sccm, a hydrogen flow rate of 5 sccm, and an argon flow rate of 500 sccm.

In the case of conducting a nitridation treatment by a high density plasma treatment, a mixed gas of nitrogen ($N_2$) and argon (Ar) is introduced. The mixed gas used here may be introduced with a nitrogen flow rate of 20 to 2000 sccm and an argon flow rate of 100 to 10000 sccm. For example, the mixed gas may be introduced with a nitrogen flow rate of 200 sccm and an argon flow rate of 1000 sccm.

In this embodiment mode, the first insulating film 304 formed on the semiconductor film 303 which is provided in the memory portion functions as a tunnel oxide film of a nonvolatile memory element which is completed later. Thus, the thinner the first insulating film 304 is, the easier it will be for tunnel current to flow through the film, and thus higher-speed operation of the memory element is possible. Meanwhile, the thinner the first insulating film 304 is, the easier it will be for charges to be accumulated in the charge accumulating layer 305 with a low voltage, and thus lower power consumption of the semiconductor device can be achieved. Therefore, the first insulating film 304 is preferably formed to be thin (for example, a thickness of 10 nm or less).

As a general method for forming a thin insulating film over a semiconductor film, there is a thermal oxidation method. However, when a substrate which does not have a sufficiently high melting point such as a glass substrate is used as the substrate 301, it is quite difficult to form the first insulating film 304 by a thermal oxidation method. In addition, an insulating film formed by a CVD method or a sputtering method does not have a sufficient film quality due to its internal defects, and has a problem in that defects such as pin holes are produced when the film is formed thin. Furthermore, when an insulating film is formed by the CVD method or the sputtering method, the coverage at the end portion of the semiconductor film is not sufficient, and there may be a case where a conductive film or the like which is formed over the first insulating film 304 later is shorted to the semiconductor film. Thus, by forming the first insulating film 304 by a high density plasma treatment as shown in this embodiment mode, an insulating film which is denser than an insulating film formed by a CVD method, a sputtering method, or the like can be formed. As a result, high-speed operation of the memory element can be achieved and the charge holding properties can be improved. Note that in the case of forming the first insulating film 304 by a CVD method or a sputtering method, it is preferable to apply an oxidation, nitridation or an oxynitridation treatment to the surface of the insulating film by a high density plasma treatment after forming the insulating film. For example, a silicon oxynitride film is formed by a CVD method, then, an oxidation treatment is conducted by a high density plasma treatment, and then, a nitridation treatment is conducted.

The charge accumulating layer 305 can be formed of a conductive film, a semiconductor film, an insulating film having a defect of trapping charges in the insulating film, or an insulating film containing a conductive particle or a semiconductive particle such as silicon. For example, as the charge accumulating layer 305, a film containing silicon (Si) as a main component can be formed. Alternatively, a film containing germanium, such as germanium (Ge), a silicon germanium alloy or the like can be formed. Here, a film containing germanium as a main component is formed as the charge accumulating layer 305 to a thickness of 1 to 20 nm, preferably 5 to 10 nm by conducting a plasma CVD method under an atmosphere containing a germanium element (e.g., $GeH_4$). In that case, the semiconductor film 303 is formed using a material containing Si as a main component, and a film containing germanium which has a lower energy gap than Si is provided as the charge accumulating layer 305 over the semiconductor film 303 with the first insulating film 304 functioning as the tunnel oxide film interposed therebetween. In this case, a second barrier against charges of the charge accumulating layer 305, which is formed by the insulating film has higher energy than a first barrier against charges of the semiconductor film 303, which is formed by the insulating film. As a result, injection of electric charges into the charge accumulating layer 305 from the semiconductor film 303 be facilitated, and charges in the charge accumulating layer 305 can be prevented from disappearing. That is, when the nonvolatile memory element operates as a memory element, highly efficient writing can be conducted with a low voltage, and the charge holding properties can be improved. Furthermore, the charge accumulating layer 305 formed over the semiconductor film 303 which is provided in the memory portion functions as the floating gate of the nonvolatile memory element which is completed later.

In addition, the charge accumulating layer 305 may be formed from an insulating film containing a nitrogen element, for example, a silicon nitride (SiNx) film, a silicon nitride oxide (SiNxOy) (x>y) film, a silicon oxynitride (SiOxNy) (x>y) film or such an insulating film containing a conductive particle or a semiconductive particle. For example, a silicon nitride film having a defect to trap charges in the film may be formed to a thickness of 1 to 20 nm, preferably 1 to 10 nm.

Figure 10B:
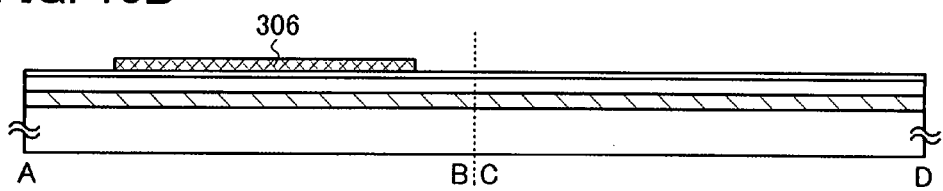

Next, the charge accumulating layer 305 is selectively removed to form a charge accumulating layer 306 (FIG. 10B). In this step, it is removed such that the charge accumulating layer 305 is left over the semiconductor film 303 included in a nonvolatile memory element which is completed later.

Figure 10C:
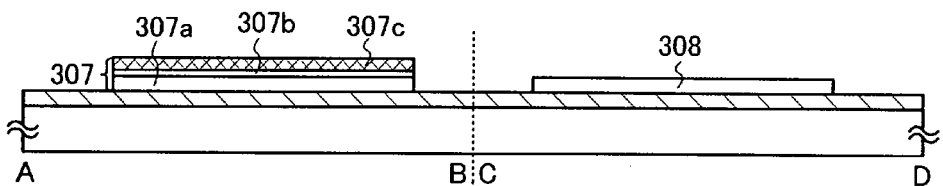

Then, the first insulating film 304 and the semiconductor film 303 are selectively removed to form a stacked body 307 in which a semiconductor film 307a, a first insulating film 307b and a charge accumulating layer 307c are sequentially stacked and an island-shaped semiconductor film 308 (FIG. 10C).

Figure 10D:
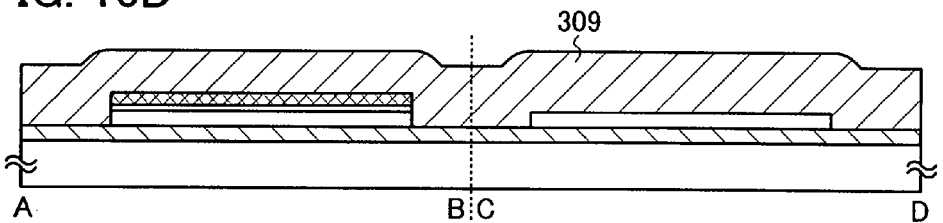

Then, a second insulating film 309 is formed to cover the stacked body 307 and the semiconductor film 308 (FIG. 10D).

The second insulating film 309 can be formed from silicon oxide, silicon oxynitride, silicon nitride oxide, diamond like carbon (DLC) or the like by a CVD method, a sputtering method or the like. Alternatively, the second insulating film 309 can be formed as a single layer structure or a stacked structure including an organic material such as polyimide, polyamide, polyvinyl phenol, benzocyclobutene, acrylic, or epoxy; a siloxane material such as a siloxane resin; an oxazole resin; and the like formed by a spin coating method, a droplet discharging method, a screen printing method or the like.

Figure 10E:
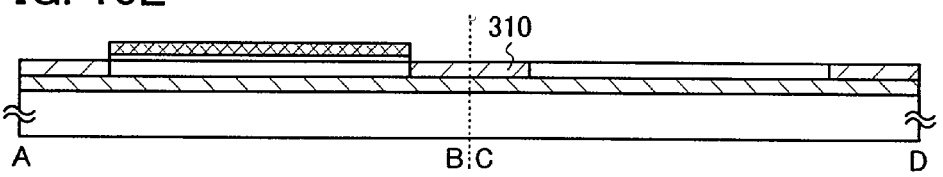

Then, the second insulating film 309 is selectively removed to leave a part thereof, and thus, surfaces of the charge accumulating layer 307c and the semiconductor film 308 are exposed (FIG. 10E, FIG. 12). Note that the left second insulating film 309 is denoted by a second insulating film 310. The second insulating film 309 can be removed by any of the methods described in the above embodiment modes.

The second insulating film 309 is removed to expose the surfaces of the charge accumulating layer 306 and the semiconductor film 308, preferably in such a way that the surface of the semiconductor film 308 and the surface of the left second insulating film 310 are at the same level in height. In that case, disconnection or the like can be prevented at an end portion of the stacked body 307 or the semiconductor film 308, when an insulating film or a conductive film to be formed later crosses the stacked body 307 or the semiconductor film 308.

Further, it is preferable that the second insulting film 309 is removed to expose the entire surfaces of the charge accumulating layer 307c and the semiconductor film 308; however, it may be removed so as to expose at least a part of the surfaces of the charge accumulating layer 307c and the semiconductor film 308.

Note that the surfaces of the semiconductor film 308 and the second insulating film 310 are preferably at exactly the same level in height; however, as long as a level difference between the surface of the semiconductor film 308 and the surface of the second insulating film 310 is smaller than the level of the semiconductor film 308, the surface of the second insulating film 310 may be at a higher level or a lower level than that of the semiconductor film 308. This is because a level difference at an end portion of the stacked body 307 or an end portion of the semiconductor film 308 can be reduced even in this case.

Figure 11A:
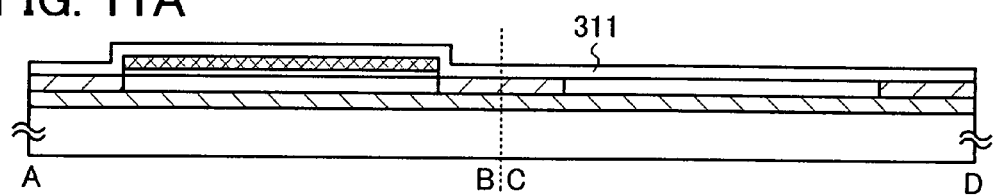
FIGS. 11A to 11D show an example of a manufacturing method of a semiconductor device according to an aspect of the present invention.

Then, a third insulating film 311 is formed over the charge accumulating layer 307c, the semiconductor film 308 and the second insulating film 310 (FIG. 11A).

The third insulating film 311 is formed by a CVD method, a sputtering method, or the like using an insulating material such as silicon oxide, silicon nitride, silicon oxynitride, or silicon nitride oxide with a single layer structure or a stacked structure. For example, in the case of the third insulating layer 311 with a single layer structure, a silicon oxynitride film or a silicon nitride oxide film is formed by a CVD method to a thickness of 5 nm to 50 nm. In addition, in the case of forming the third insulating layer 311 with a three-layer structure, a silicon oxynitride film may be formed as the first insulating layer, a silicon nitride film may be formed as the second insulating layer, and a silicon oxynitride film may be formed as the third insulating layer. Alternatively, an oxide or a nitride of germanium may be used for the third insulating layer 311.

A high density plasma treatment is conducted to an insulating film formed by the above described method to form the third insulating film 311. For example, a silicon oxynitride film or a silicon nitride oxide film is formed by a CVD method, then, an oxidation treatment or a nitridation treatment is conducted by a high density plasma treatment, thereby forming the third insulating film 311. Naturally, a nitridation treatment may be conducted after conducting an oxidation treatment as described above. By conducting a high density plasma treatment to an insulating film formed by a CVD method or a sputtering method, the insulating film can be made denser, and defect level density which will trap electrons or holes can be reduced.

The third insulating film 311 formed over the semiconductor film 307a serves as a control insulating film in a nonvolatile memory element which is completed later, and the third insulating film 311 formed over the semiconductor film 308 serves as a gate insulating film in a transistor which is completed later.

Figure 11B:
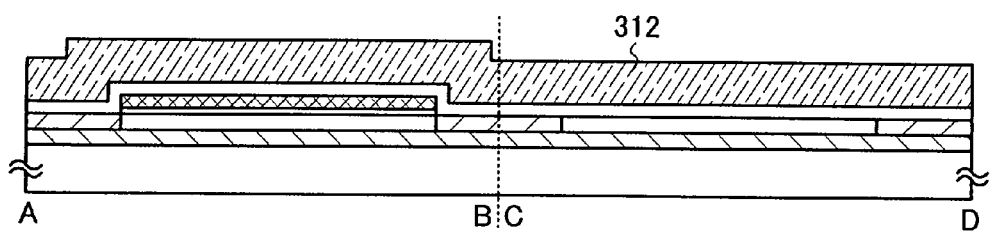

Then, a conductive film 312 is formed over the third insulating film 311 (FIG. 11B).

The conductive film 312 can be formed using an element selected from tantalum (Ta), tungsten (W), titanium (Ti), molybdenum (Mo), aluminum (Al), copper (Cu), chromium (Cr), niobium (Nb), and the like; or an alloy material or a compound material containing the element as a main component. In addition, a metal nitride film 312 can be formed using a semiconductor material typified by polycrystalline silicon obtained by nitriding such an element can be used. Alternatively, the conductive film doped with an impurity element such as phosphorus.

Here, the conductive film 312 is formed to have a structure in which tantalum nitride and tungsten are sequentially stacked. Further, a structure in which a metal nitride film and a metal film are sequentially stacked can be employed for the conductive film 312.

Figure 11C:
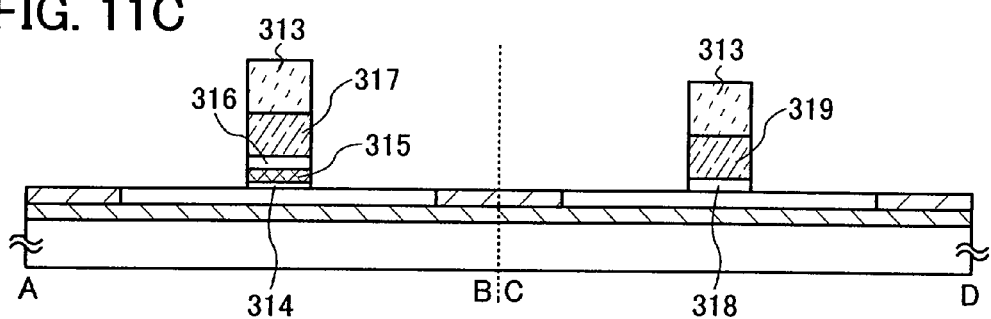

Then, a resist 313 is selectively formed over the conductive film 312, and the conductive film 312, the third insulating film 311, the charge accumulating layer 307c, and the first insulating film 307b are selectively etched using the resist 313 as a mask (FIG. 11C and FIG. 13). Here, a first insulating film 314 serving as a tunnel insulating film, a charge accumulating layer 315, a third insulating film 316 serving as a control insulating film, and a conductive film 317 serving as a gate electrode are left in a part over the semiconductor film 307a, and a third insulating film 318 serving as a gate insulating film and a conductive film 319 serving as a gate electrode are left in a part over the semiconductor film 308.

Figure 11D:
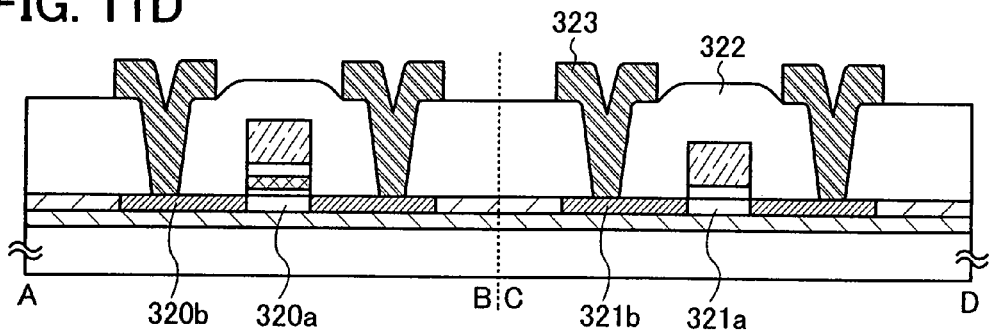

Then, an impurity element is added to the semiconductor films 307a, 308 using the conductive films 317, 319 as masks, thereby forming a channel forming region 320a and impurity regions 320b serving as source and drain regions in the semiconductor film 307a, and a channel forming region 321a and impurity regions 321b serving as source and drain regions in the semiconductor film 308. Then, an insulating film 322 is formed to cover the conductive films 317, 319, the semiconductor films 307a, 308 and/or the like, and a conductive film 323 serving as source and drain electrodes is selectively formed over the insulating film 322 (FIG. 11D, FIG. 21A, FIG. 14).

The insulating film 322 can be formed from silicon oxide, silicon oxynitride, silicon nitride oxide, or the like by a CVD method, a sputtering method or the like. Alternatively, the insulating film 322 can be formed with a single layer structure or a stacked structure including an organic material such as polyimide, polyamide, polyvinyl phenol, benzocyclobutene, acrylic, or epoxy; a siloxane material such as a siloxane resin; an oxazole resin; and the like. It is to be noted that a siloxane material corresponds to a material including a Si—O—Si bond. Siloxane is a material having a skeletal structure with the bond of silicon (Si) and oxygen (O). As a substituent, an organic group containing at least hydrogen (e.g., an alkyl group or aromatic hydrocarbon) is used. Alternatively, a fluoro group can be used as the substituent, or both a fluoro group and an organic group containing at least hydrogen can be used as the substituent. An oxazole resin includes, for example, photosensitive polybenzoxazole or the like. Photosensitive polybenzoxazole is a material having a low dielectric constant (dielectric constant of 2.9 at 1 MHz at room temperature), high heat resistance (thermal decomposition temperature of 550° C. with a temperature rise of 5° C./min by TGA (Thermal Gravity Analysis)), and a low water absorbing rate (0.3% at room temperature for 24 hours). An oxazole resin has a relative lower dielectric constant (approximately 2.9) as compared with a relative dielectric constant of polyimide or the like (approximately 3.2 to 3.4). Therefore, generation of parasitic capacitance can be suppressed and high-speed operation can be performed. Here, as the insulating film 322, silicon oxide, silicon oxynitride (SiOxNy) (x>y>0), or silicon nitride oxide (SiNxOy) (x>y>0) is formed by a CVD method as a single layer structure or a stacked structure. Further, the insulating film 322 may be formed as a stacked layer of an organic material such as polyimide, polyamide, polyvinyl phenol, benzocyclobutene, acrylic, or epoxy; a siloxane material such as a siloxane resin; or an oxazole resin.

The conductive film 323 can be formed with a single layer structure or a stacked structure using one kind of metal selected from aluminum, tungsten, titanium, tantalum, molybdenum, nickel, neodymium, and the like; or an alloy containing a plurality of the elements. For example, as a conductive film formed using an alloy containing a plurality of the elements, an aluminum alloy containing titanium, an aluminum alloy containing neodymium, or the like can be used. In a case where the conductive film 323 has a stacked structure, for example, a stacked structure in which an aluminum layer or an aluminum alloy layer as described above is interposed between titanium layers may be employed.

Through the above described steps, a semiconductor device having a nonvolatile memory element can be manufactured. In addition, as shown in Embodiment Mode 2, the nonvolatile memory element may have a structure in which a sidewall is formed to be in contact with side faces of the conductive film 317, the third insulating film 316, the charge accumulating layer 315 and/or the like.

In the above described manufacturing steps, after forming the insulating film 309 (FIG. 10D), a part of the insulating film 309 is removed to expose the surface of the semiconductor film 308 and to leave the insulating film 310; however, as shown in FIGS. 20A to 20D, the insulating film 309 may be removed. Hereinafter, description is made, with reference to FIGS. 20A to 20D.

Figure 20A:
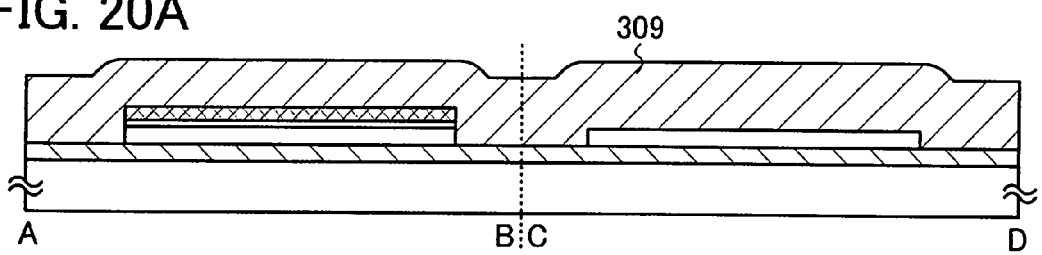
FIGS. 20A to 20D show an example of a manufacturing method of a semiconductor device according to an aspect of the present invention.
Figure 21A:
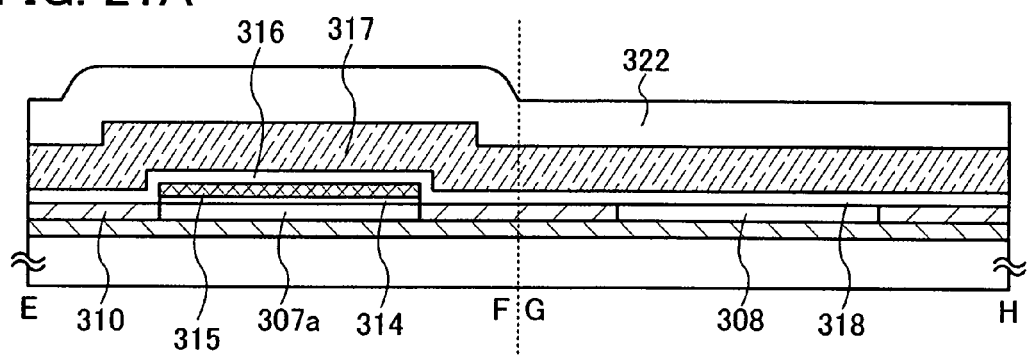
FIGS. 21A and 21B show an example of a semiconductor device according to an aspect of the present invention.
Figure 21B:
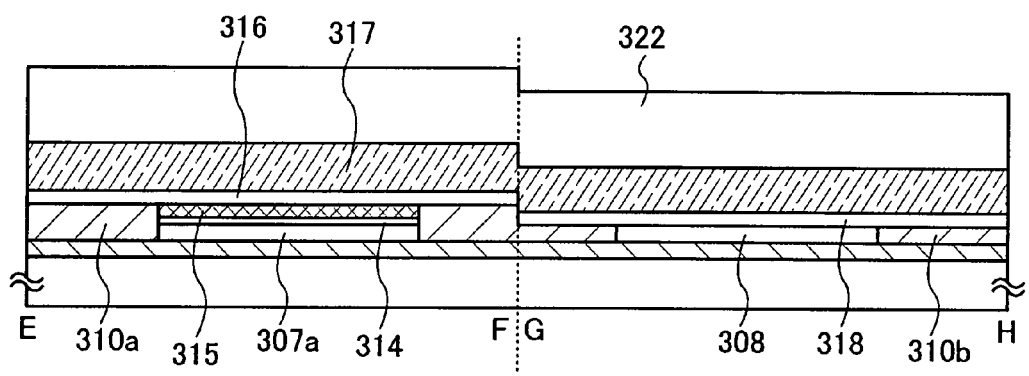

The structure shown in FIG. 10D is formed by the above described method (FIG. 20A).

Figure 20B:
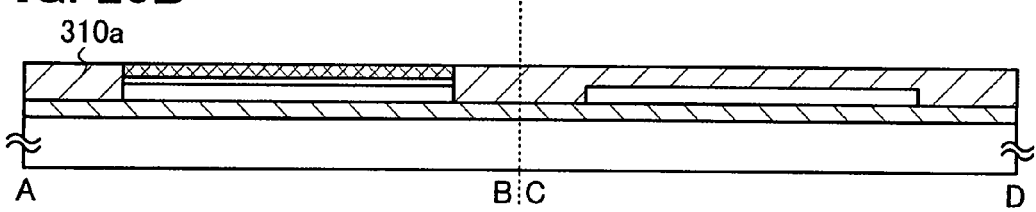

Then, a part of the insulating film 309 is removed to expose the surface of the charge accumulating layer 307c, thereby leaving the insulating film 310a (FIG. 20B). At that time, the insulating film 309 is removed so as not to expose the surface of the semiconductor film 308. In this case, it is preferable that the surface of the charge accumulating layer 307c and the surface of the insulating film 310a are provided to be at almost the same level in height, since disconnection of the third insulating film 311 or the conductive film 312 to be formed later can be prevented.

Figure 20C:
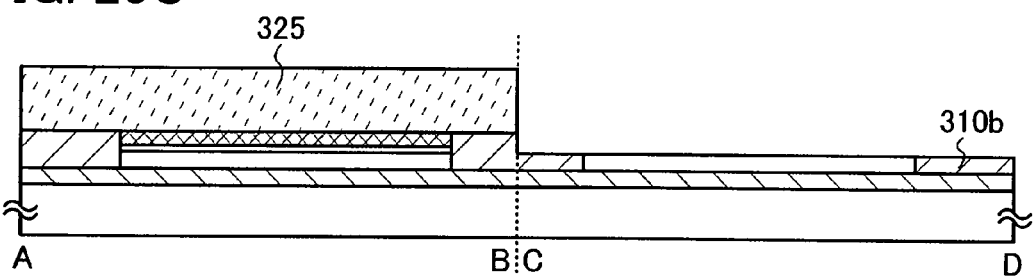

Next, a resist 325 is formed over the charge accumulating layer 307c and the insulating film 310a provided in the vicinity of the charge accumulating layer 307c, and the insulating film 310a which is not covered with the resist 325 is removed to expose the surface of the semiconductor film 308, thereby leaving the insulating film 310b (FIG. 20C). Note that at this time, it is preferable that the surface of the semiconductor film 308 and the surface of the insulating film 310b are provided at almost the same level in height, since defective connection (disconnection) caused by the level difference between the semiconductor film 308 and the insulating film 310b, of the third insulating film 311 or the conductive film 312 to be formed later can be prevented. By adopting different etching methods in FIG. 20B and FIG. 20C, damages to the semiconductor film 308 caused by exposure of the surface of the semiconductor film 308 at the time of removing the insulating film 309 can be reduced. For example, it is possible that in FIG. 20B, the insulating film 309 is removed by dry etching using the charge accumulating layer 307c as a stopper, and in FIG. 20C, the insulating film 310a is removed by wet etching which gives fewer damages to the surface of the semiconductor film 308.

Figure 20D:
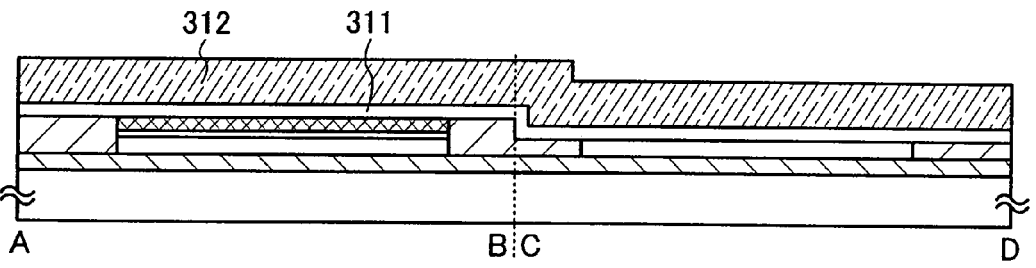

Then, the third insulating film 311 and the conductive film 312 are formed to cover the insulating film 310a, 310b, the charge accumulating layer 307c, and the semiconductor film 308 (FIG. 20D). Then, a semiconductor device having a nonvolatile memory element can be manufactured by the above described method (FIG. 21B).

In this manner, by employing the method shown in FIGS. 20A to 20D, in a nonvolatile memory element and a thin film transistor, disconnection or the like of the insulating films 316, 318 can be prevented at an end portion of the charge accumulating layer 315 or at an end portion of the semiconductor film 308.

This embodiment mode can be freely combined with any of the other embodiment modes in this specification.

Embodiment Mode 5

Embodiment Mode 5 will describe examples of usage modes of the semiconductor device shown in the above embodiment mode. Specifically, an application example of a semiconductor device in which data can be inputted and outputted without contact will be explained hereinafter with reference to drawings. The semiconductor device in which data can be inputted and outputted without contact is also referred to as an RFID tag, an ID tag, an IC tag, an IC chip, an RF tag, a wireless tag, an electronic tag, or a wireless chip depending on the usage mode.

First, an example of a top-surface structure of the semiconductor device shown in this embodiment mode will be explained with reference to FIG. 15A. A semiconductor device 80 shown in FIGS. 15A to 15C includes a thin film integrated circuit 131 provided with a plurality of elements such as thin film transistors included in a memory portion and a logic portion and a conductive film 132 serving as an antenna. The conductive film 132 serving as an antenna is electrically connected to the thin film integrated circuit 131.

When a thin film transistor is provided in the thin film integrated circuit 131, the structure described in the above embodiment mode can be applied.

Figure 15A:
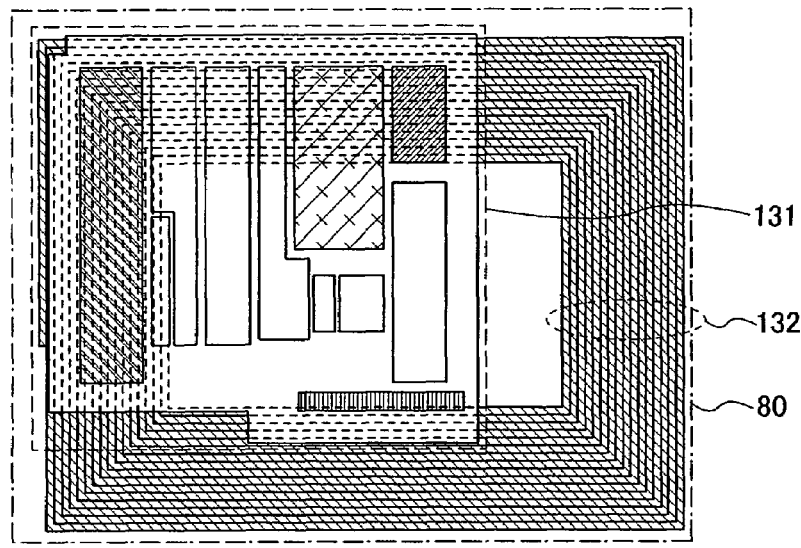
FIGS. 15A to 15C show examples of semiconductor devices according to an aspect of the present invention.
Figure 15B:
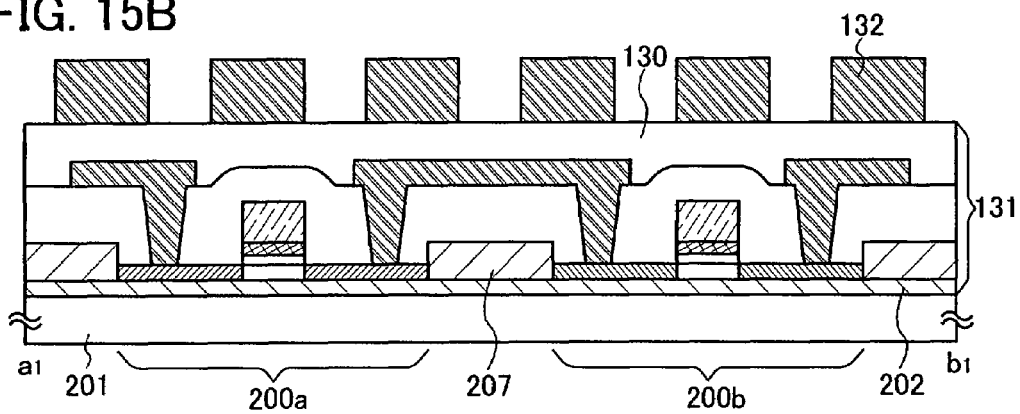
Figure 15C:
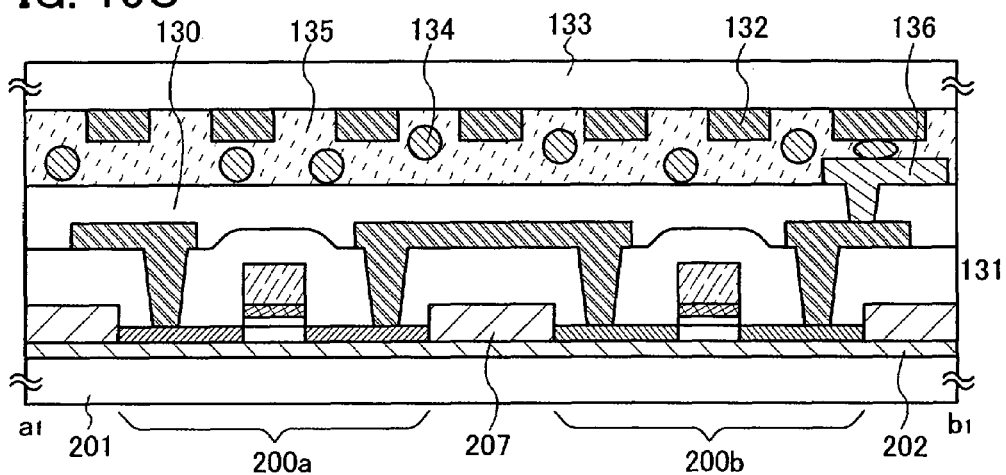

FIGS. 15B and 15C are schematic views of a cross section of FIG. 15A. The conductive film 132 serving as an antenna may be provided above the elements included in the memory portion and the logic portion; for example, the conductive film 132 serving as an antenna can be provided above the structure shown in the embodiment modes described above, with an insulating film 130 interposed therebetween (FIG. 15B). In addition, the conductive film 132 serving as an antenna can be provided so as to be attached to a thin film integrated circuit 131 after the conductive film 132 serving as an antenna is separately provided for a substrate 133 (FIG. 15C). Here, a conductive film 136 provided over the insulating film 130 and the conductive film 132 serving as an antenna are electrically connected to each other through a conductive particle 134 included in a resin 135 having adhesiveness.

Although this embodiment mode shows an example in which the conductive film 132 serving as an antenna is provided in a coil-like shape and an electromagnetic induction method or an electromagnetic coupling method is applied, the semiconductor device of the present invention is not limited thereto, and a microwave method can also be applied. In a case of a microwave method, the shape of the conductive film 132 serving as an antenna may be appropriately determined depending on the wavelength of an electromagnetic wave to be used.

Figure 16A:
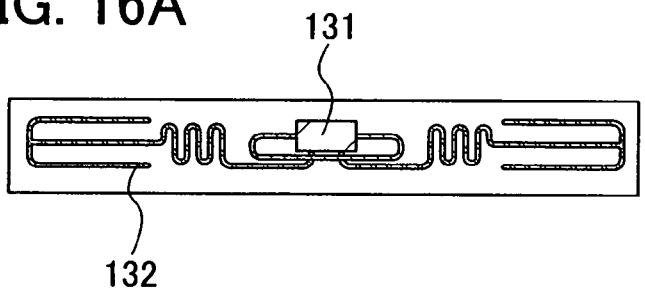
FIGS. 16A to 16D show usage examples of semiconductor devices according to an aspect of the present invention.
Figure 16B:
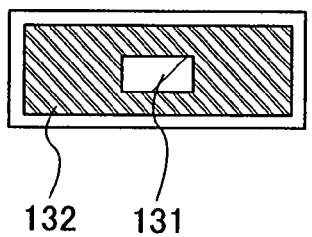
Figure 16C:
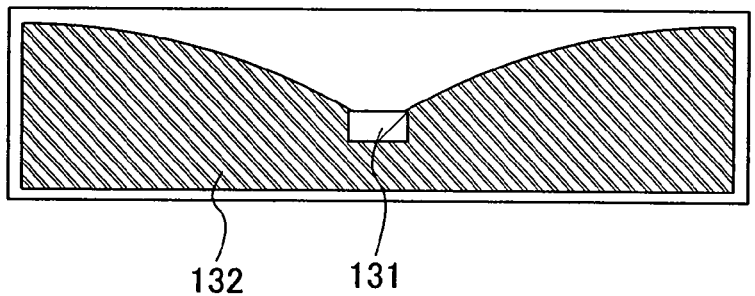
Figure 16D:
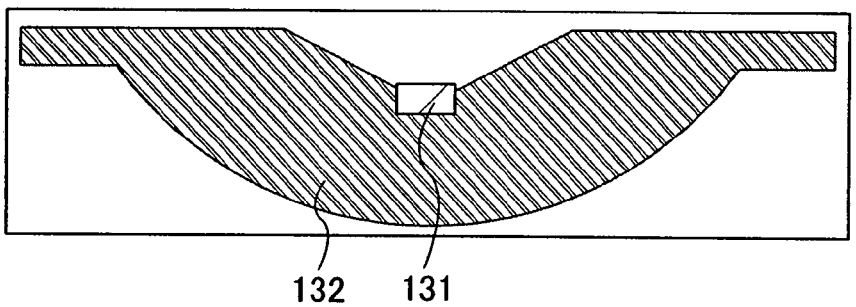

For example, in a case of employing, for example, a microwave method (for example, a UHF band (860 to 960 MHz band), a 2.45 GHz band, or the like) as the signal transmission method in the semiconductor device 80, the shape such as a length of the conductive layer serving as an antenna may be appropriately set in consideration of a wavelength of an electromagnetic wave used for signal transmission. For example, the conductive film serving as an antenna can be formed into a linear shape (for example, a dipole antenna (FIG. 16A)), a flat shape (for example, a patch antenna (FIG. 16B)), a ribbon shape (FIGS. 16C and 16D), or the like. The shape of the conductive film 132 serving as an antenna is not limited to a linear shape, and the conductive film serving as an antenna may be formed with a curved-line shape, a meander shape, or a combination thereof, in consideration of a wavelength of an electromagnetic wave.

The conductive film 132 serving as an antenna is formed using a conductive material by a CVD method, a sputtering method, a printing method such as screen printing or gravure printing, a droplet discharging method, a dispenser method, a plating method, or the like. The conductive material is formed with a single layer structure of an element of aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing these elements as its main component; or a stacked structure thereof.

For example, in a case of forming the conductive film 132 serving as an antenna by, for example, a screen printing method, the conductive film can be provided by selective printing of conductive paste in which conductive particles each having a grain size of several nm to several tens of Km are dissolved or dispersed in an organic resin. As the conductive particles, one or more of metal particles such as silver (Ag), gold (Au), copper (Cu), nickel (Ni), platinum (Pt), palladium (Pd), tantalum (Ta), molybdenum (Mo), and titanium (Ti), fine particles of silver halide, or dispersible nanoparticles can be used. In addition, as the organic resin included in the conductive paste, one or a plurality of organic resins each serving as a binder, a solvent, a dispersant, or a coating of the metal particle can be used. Typically, an organic resin such as an epoxy resin or a silicone resin can be used. In forming a conductive film, baking is preferably performed after the conductive paste is pushed out. For example, in a case of using fine particles (the grain size of 1 nm to 100 nm) containing silver as its main component as a material of the conductive paste, the conductive paste can be cured by baking at temperatures of 150 to 300° C., thereby forming a conductive film. Alternatively, fine particles containing solder or lead-free solder as its main component may be used; in this case, it is preferable to use a fine particle having a grain size of 20 μm or less. Solder or lead-free solder has an advantage such as low cost.

Next, an operation of the semiconductor device shown in this embodiment mode will be explained.

Figure 17A:
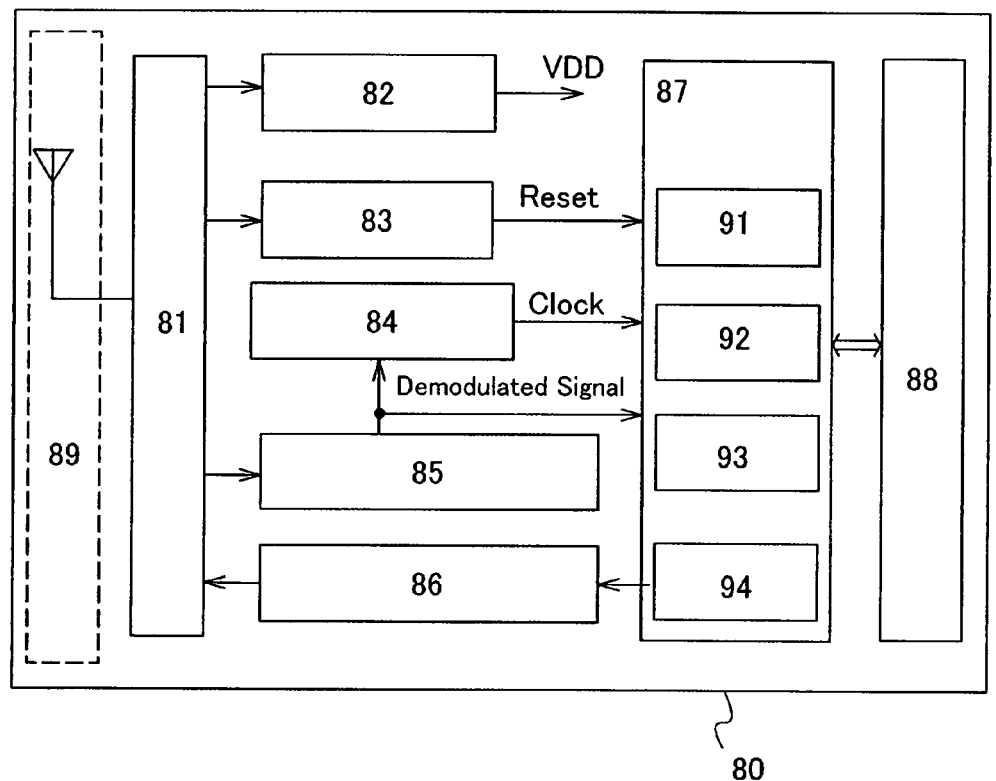
FIG. 17A shows an example of a semiconductor device according to an aspect of the present invention.

The semiconductor device 80 has a function of exchanging data without contact, and has a high-frequency circuit 81, a power supply circuit 82, a reset circuit 83, a clock generating circuit 84, a data demodulating circuit 85, a data modulating circuit 86, a control circuit 87 for controlling another circuit, a memory circuit 88, and an antenna 89 (FIG. 17A). The high-frequency circuit 81 receives a signal from the antenna 89 and outputs a signal, which is received from the data modulating circuit 86, from the antenna 89. The power supply circuit 82 generates a power supply potential from the received signal. The reset circuit 83 generates a reset signal. The clock generating circuit 84 generates various clock signals based on a received signal inputted from the antenna 89. The data demodulating circuit 85 demodulates a received signal and outputs the demodulated signal to the control circuit 87. The data modulating circuit 86 modulates a signal received from the control circuit 87. As the control circuit 87, for example, a code extracting circuit 91, a code determining circuit 92, a CRC determining circuit 93, and an output unit circuit 94 are provided. It is to be noted that the code extracting circuit. 91 extracts each of plural codes included in an instruction sent to the control circuit 87. The code determining circuit 92 determines the content of the instruction by comparing the extracted code with a reference code. The CRC determining circuit 93 detects whether or not there is a transmission error or the like based on the determined code.

Subsequently, an example of an operation of the aforementioned semiconductor device will be explained. First, a wireless signal is received by the antenna 89 and then sent to the power supply circuit 82 through the high-frequency circuit 81, thereby generating a high power supply potential (hereinafter referred to as VDD). The VDD is supplied to circuits in the semiconductor device 80. A signal sent to the data demodulating circuit 85 via the high-frequency circuit 81 is demodulated (hereinafter this signal is referred to as a demodulated signal). Moreover, signals passed through the reset circuit 83 and the clock generating circuit 84 via the high-frequency circuit 81, and the demodulated signal are sent to the control circuit 87. The signals sent to the control circuit 87 are analyzed by the code extracting circuit 91, the code determining circuit 92, the CRC determining circuit 93, or the like. Then, based on the analyzed signals, the information of the semiconductor device 80 stored in the memory circuit 88 is outputted. The outputted information on the semiconductor device 80 is encoded through the output unit circuit 94. Further, the encoded information on the semiconductor device 80 passes through the data modulating circuit 86 and then is sent by the antenna 89 as a wireless signal. It is to be noted that a low power supply potential (hereinafter referred to as VSS) is common in the plural circuits included in the semiconductor device 80 and VSS can be GND.

In this manner, when a signal is sent from a reader/writer to the semiconductor device 80 and the signal sent from the semiconductor device 80 is received by the reader/writer, the data of the semiconductor device can be read.

Moreover, in the semiconductor device 80, power supply voltage may be supplied to each circuit by electromagnetic waves without mounting a power supply (battery), or a power supply (battery) may be mounted so that power supply voltage is supplied to each circuit by electromagnetic waves or the power supply (battery).

Figure 17B:
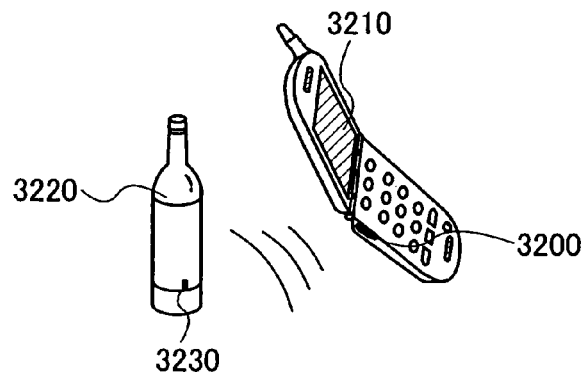
FIGS. 17B and 17C show usage examples of the semiconductor device.
Figure 17C:
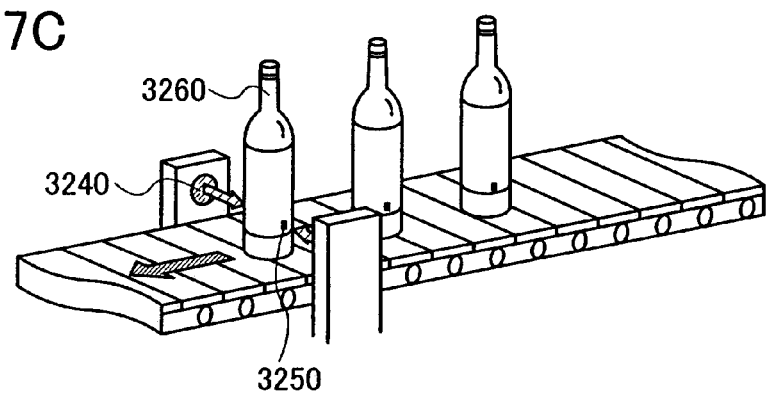
Figure 18A:
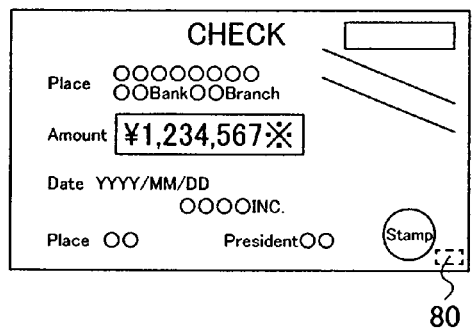
FIGS. 18A to 18H show usage examples of a semiconductor device according to an aspect of the present invention.
Figure 18B:
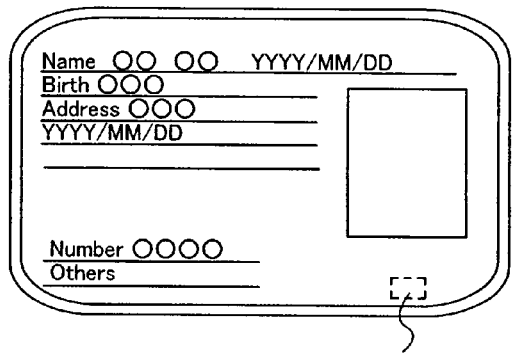
Figure 18C:
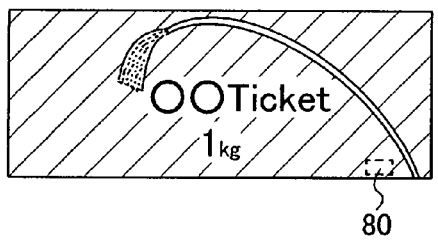
Figure 18D:
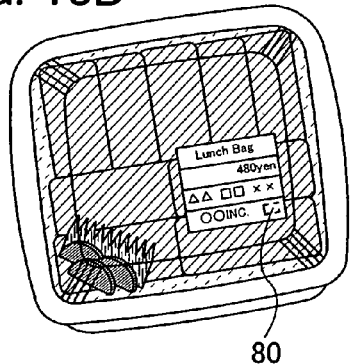
Figure 18E:
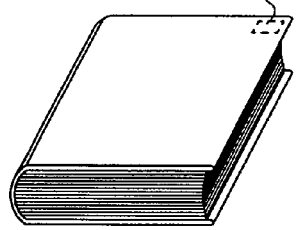
Figure 18F:
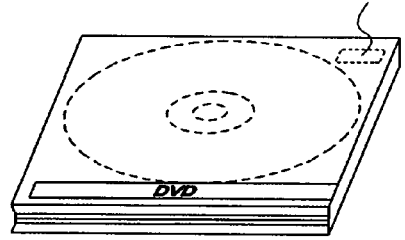
Figure 18G:
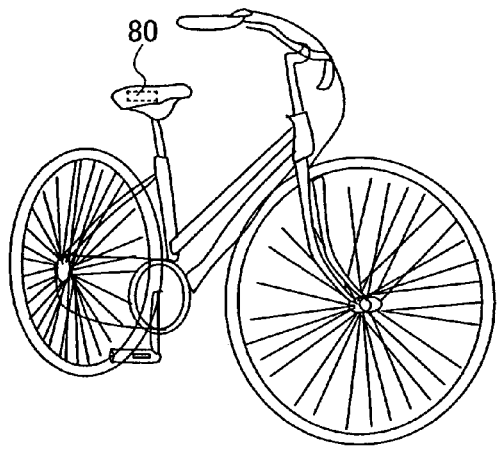
Figure 18H:
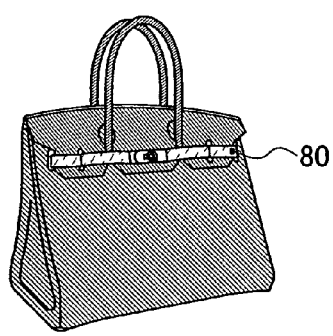
Figure 19A:
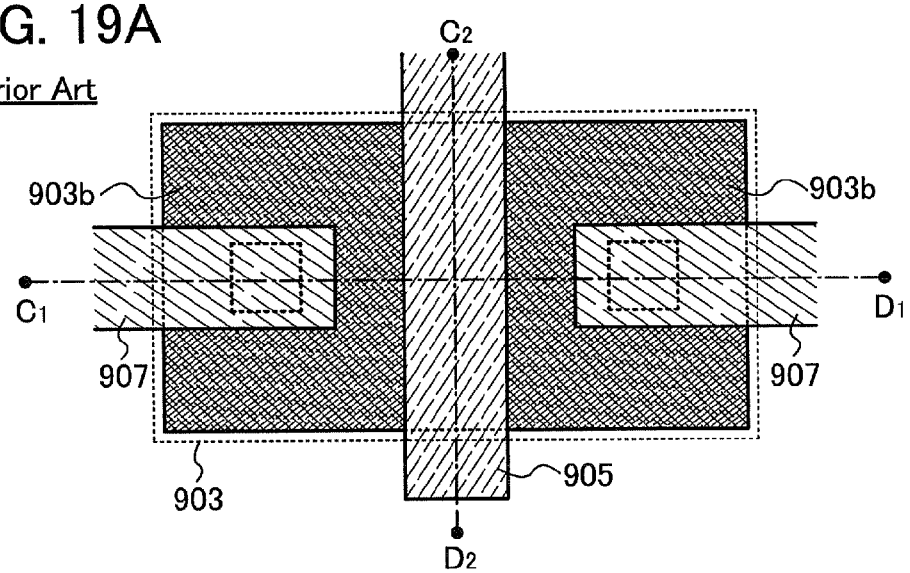
FIGS. 19A to 19C show an example of a conventional semiconductor device.
Figure 19B:
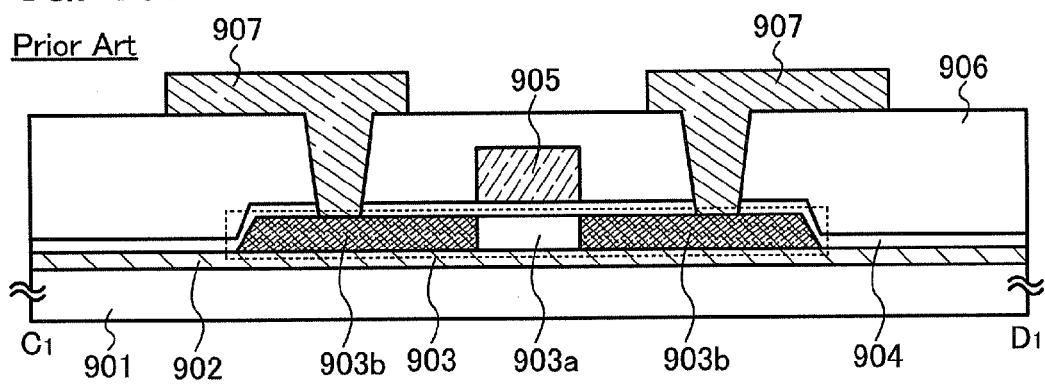
Figure 19C:
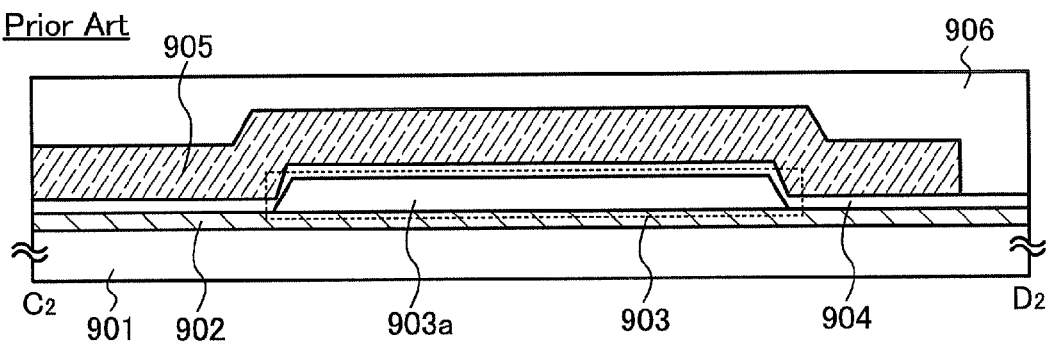

Next, an example of a usage mode of the semiconductor device in which data can be inputted and outputted without contact will be explained. A side surface of a mobile terminal including a display portion 3210 is provided with a reader/writer 3200. A side surface of a product 3220 is provided with a semiconductor device 3230 (FIG. 17B). When the reader/writer 3200 is held over the semiconductor device 3230 included in the product 3220, the display portion 3210 displays information on the product, such as a material, a production area, an inspection result for each production step, history of circulation process, and description of the product. In addition, when a product 3260 is transferred by a conveyer belt, the product 3260 can be inspected with the use of a semiconductor device 3250 provided for the product 3260, and a reader/writer 3240 (FIG. 17C). In this manner, with the use of the semiconductor device for the system, information can be obtained easily and higher performance and higher value added are achieved.

In addition to the above, the semiconductor device of the present invention can be applied in a wide range. The semiconductor device can be applied to any object, when the information of the object, such as history of the object is clarified without contact and the object is useful for production, management, and so on. For example, the semiconductor device of the present invention can be provided and used for bills, coins, securities, certificates, bearer bonds, containers for wrapping, books, storage media, personal belongings, vehicles, groceries, clothing, health products, daily commodities, medicines, electronic devices, and the like. Examples of these will be explained with reference to FIGS. 18A to 18H.

The bills and coins are money that is distributed in the market, and include one that can be used in the same way as money in a specific area (such as cash voucher), commemorative coins, and the like. The securities indicate checks, certificates, promissory notes, and the like (see FIG. 18A). The certificates indicate driver's licenses, resident's cards, and the like (see FIG. 18B). The bearer bonds indicate stamps, rice coupons, various gift coupons, and the like (see FIG. 18C). The containers for wrapping indicate wrappers for a packaged lunch and the like, plastic bottles, and the like (see FIG. 18D). The books indicate paperback books, hardback books, and the like (see FIG. 18E). The storage media indicate DVD software, video tapes, and the like (see FIG. 18F). The vehicles indicate wheeled vehicles such as bicycles, ships, and the like (see FIG. 18G). The personal belongings indicate bags, glasses, and the like (see FIG. 18H). The groceries indicate foods, beverages, and the like. The clothing indicates clothes, shoes, and the like. The health products indicate medical apparatus, health appliances, and the like. The daily commodities indicate furniture, lighting apparatus, and the like. The medicines indicate drugs, agricultural chemicals, and the like. The electronic devices indicate liquid crystal display devices, EL display devices, television devices (television receiver or thin television receiver), cellular phones, and the like.

By provision of the semiconductor device 80 for bills, coins, securities, certificates, bearer bonds, and the like, forgery thereof can be prevented. In addition, by provision of the semiconductor device 80 for containers for wrapping, books, storage media, personal belongings, groceries, daily commodities, electronic devices, and the like, efficiency of an inspection system, a system of a rental store, and the like can be improved. By provision of the semiconductor device 80 for vehicles, health products, medicines, and the like, forgery and theft thereof can be prevented, and accidental ingestion of a drug can be prevented in the case of the medicines. The semiconductor device 80 can be provided by being attached to a surface of an object or being implanted in an object. For example, the semiconductor device can be implanted in paper in the case of a book, and can be implanted in an organic resin in the case of a package formed of the organic resin.

By provision of the semiconductor devices for containers for wrapping, storage media, personal belongings, groceries, clothing, daily commodities, electronic devices, and the like, an inspection system and a system of a rental store, and the like can be made efficient. By provision of the semiconductor devices for vehicles, forgery and theft thereof can be prevented. By implantation of the semiconductor devices in creatures such as animals, identification of the individual creature can be easily carried out. For example, by implantation of the semiconductor device equipped with a sensor in a creature such as livestock, it is possible to easily know not only a year of birth, sex, and kind but also a health condition such as body temperature.

This embodiment mode can be freely combined with any of the other embodiment modes in this specification.

This application is based on Japanese Patent Application serial no. 2006-126636 filed in Japan Patent Office on Apr. 28, 2006 the entire contents of which are hereby incorporated by reference.

What is claimed is:

1. A semiconductor device comprising:
    an island-shaped semiconductor film formed over a substrate, including:
        a source region,
        a drain region,
        a channel forming region between the source region and the drain region, and
        impurity regions having a conductivity type different from that of the source region and the drain region;
    a first insulating film in contact with a top face of the island-shaped semiconductor film;
    a second insulating film in contact with a side face of the island-shaped semiconductor film;
    a first conductive film in contact with top face of the first insulating film; and
    a second conductive film in contact with a top surface of the first conductive film and a top surface of the second insulating film,
    wherein a part of an end portion of the island-shaped semiconductor film is coextensive with a part of an end portion of the first conductive film, and
    wherein the impurity regions are provided at end portions of the island-shaped semiconductor film and adjacent with the channel forming region, the source region and the drain region.

2. The semiconductor device according to claim 1, wherein a thickness of the second insulating film is larger that of the island-shaped semiconductor film.

3. The semiconductor device according to claim 1, wherein the island-shaped semiconductor film is surrounded by the second insulating film.

4. A semiconductor device comprising:
    a plurality of island-shaped semiconductor films formed over a substrate, each of the plurality of island-shaped semiconductor films including:
        a source region,
        a drain region,
        a channel forming region between the source region and the drain region, and
        impurity regions having a conductivity type different from that of the source region and the drain region;
    a first insulating film in contact with a top face of the plurality of island-shaped semiconductor films;
    a second insulating film in contact with a side face of the plurality of island-shaped semiconductor films;
    a first conductive film in contact with a top face of the first insulating film; and
    a second conductive film in contact with a top surface of the first conductive film and a top surface of the second insulating film,
    wherein parts of an end portion of the plurality of island-shaped semiconductor films are coextensive with a part of an end portion of the first conductive film, and
    wherein the impurity regions are provided at end portions of the plurality of island-shared semiconductor films and adjacent with the channel forming region, the source region and the drain region.

5. The semiconductor device according to claim 4, wherein a thickness of the second insulating film is larger than that of the plurality of island-shaped semiconductor films.

6. The semiconductor device according to claim 4, wherein each of the plurality of island-shaped semiconductor films is surrounded by the second insulating film.

* * * * *

UNITED STATES PATENT AND TRADEMARK OFFICE
CERTIFICATE OF CORRECTION

PATENT NO.        : 7,692,223 B2
APPLICATION NO.  : 11/785145
DATED            : April 6, 2010
INVENTOR(S)      : Atsuo Isobe et al.

It is certified that error appears in the above-identified patent and that said Letters Patent is hereby corrected as shown below:

At column 22, lines 21 to 23, please change "In addition, a metal nitride film 312 can be formed using a semiconductor material typified by polycrystalline silicon obtained by nitriding such an element can be used. Alternatively, the conductive film" to --In addition, a metal nitride film 312 obtained by nitriding such an element can be used. Alternatively, the conductive film can be formed using a semiconductor material typified by polycrystalline silicon--;

At column 25, line 38, please change "Km" to --µm--;

At column 28, line 19, please change "with top" to --with a top--;

At column 28, line 32, please change "larger that" to --larger than that--;

At column 28, line 60, please change "island-shared" to --island-shaped--.

Signed and Sealed this

Tenth Day of August, 2010

David J. Kappos
*Director of the United States Patent and Trademark Office*